United States Patent
Miyanaga

(10) Patent No.: US 10,256,291 B2
(45) Date of Patent: Apr. 9, 2019

(54) METHOD OF MANUFACTURING SEMICONDUCTOR DEVICE

(71) Applicant: Semiconductor Energy Laboratory Co., Ltd., Atsugi-shi, Kanagawa-ken (JP)

(72) Inventor: Akiharu Miyanaga, Hadano (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 464 days.

(21) Appl. No.: 14/614,970

(22) Filed: Feb. 5, 2015

(65) Prior Publication Data

US 2015/0144947 A1 May 28, 2015

Related U.S. Application Data

(63) Continuation of application No. 13/570,517, filed on Aug. 9, 2012, now Pat. No. 8,952,378, which is a (Continued)

(30) Foreign Application Priority Data

Jul. 17, 2009 (JP) ................................. 2009-168650

(51) Int. Cl.
 *H01L 27/12* (2006.01)
 *H01L 29/04* (2006.01)
 (Continued)

(52) U.S. Cl.
 CPC .......... *H01L 29/04* (2013.01); *H01L 27/1225* (2013.01); *H01L 29/66742* (2013.01); *H01L 29/66969* (2013.01); *H01L 29/7869* (2013.01)

(58) Field of Classification Search
 None
 See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1027913 A 8/2000
EP 1452619 A 9/2004
(Continued)

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

(Continued)

*Primary Examiner* — Moazzam Hossain
*Assistant Examiner* — Stanetta Isaac
(74) *Attorney, Agent, or Firm* — Robinson Intellectual Property Law Office; Eric J. Robinson

(57) ABSTRACT

An object is to provide a method for manufacturing a highly reliable semiconductor device including a transistor with stable electric characteristics. A method for manufacturing a semiconductor device includes the steps of: forming a gate electrode over a substrate having an insulating surface; forming a gate insulating film over the gate electrode; forming an oxide semiconductor film over the gate insulating film; irradiating the oxide semiconductor film with an electromagnetic wave such as a microwave or a high frequency; forming a source electrode and a drain electrode over the oxide semiconductor film irradiated with the electromagnetic wave; and forming an oxide insulating film, which is in contact with part of the oxide semiconductor film, over the gate insulating film, the oxide semiconductor film, the source electrode, and the drain electrode.

12 Claims, 24 Drawing Sheets

Related U.S. Application Data continuation of application No. 12/835,115, filed on Jul. 13, 2010, now Pat. No. 8,241,949.

(51) Int. Cl.
  *H01L 29/66*  (2006.01)
  *H01L 29/786* (2006.01)
  *H01L 21/00*  (2006.01)

(56) References Cited

U.S. PATENT DOCUMENTS

| | | |
|---|---|---|
| 5,847,410 A | 12/1998 | Nakajima |
| 5,963,823 A | 10/1999 | Yamazaki et al. |
| 6,017,784 A | 1/2000 | Ohta et al. |
| 6,294,274 B1 | 9/2001 | Kawazoe et al. |
| 6,380,014 B1 | 4/2002 | Ohta et al. |
| 6,563,174 B2 | 5/2003 | Kawasaki et al. |
| 6,586,346 B1 | 7/2003 | Yamazaki et al. |
| 6,727,522 B1 | 4/2004 | Kawasaki et al. |
| 6,960,812 B2 | 11/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,132,373 B2 | 11/2006 | Fukuhisa et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,807,515 B2 | 10/2010 | Kato et al. |
| 7,829,444 B2 | 11/2010 | Yabuta et al. |
| 7,838,402 B2 | 11/2010 | Nagasawa et al. |
| 7,935,582 B2 | 5/2011 | Iwasaki |
| 7,955,995 B2 | 6/2011 | Kakehata et al. |
| 7,956,361 B2 | 6/2011 | Iwasaki |
| 7,968,383 B2 | 6/2011 | Honda et al. |
| 8,004,045 B2 | 8/2011 | Sasaki et al. |
| 8,063,437 B2 | 11/2011 | Sasaki et al. |
| 8,154,024 B2 | 4/2012 | Iwasaki |
| 8,188,468 B2 | 5/2012 | Ohmi et al. |
| 8,441,085 B2 | 5/2013 | Nagasawa et al. |
| 8,536,000 B2 | 9/2013 | Sasaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0241976 A1 | 12/2004 | Fukuhisa et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0224839 A1 | 9/2007 | Shimizu |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0299702 A1 | 12/2008 | Son et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0159880 A1 | 6/2009 | Honda et al. |
| 2009/0278122 A1 | 11/2009 | Hosono et al. |
| 2009/0280600 A1 | 11/2009 | Hosono et al. |
| 2010/0012899 A1 | 1/2010 | Kim et al. |
| 2010/0025678 A1 | 2/2010 | Yamazaki et al. |
| 2010/0055881 A1 | 3/2010 | Shimizu |
| 2010/0065844 A1 | 3/2010 | Tokunaga |
| 2010/0084648 A1 | 4/2010 | Watanabe |
| 2010/0085081 A1 | 4/2010 | Ofuji et al. |
| 2010/0092800 A1 | 4/2010 | Itagaki et al. |
| 2010/0102312 A1 | 4/2010 | Yamazaki et al. |
| 2010/0109002 A1 | 5/2010 | Itagaki et al. |
| 2010/0163874 A1 | 7/2010 | Koyama et al. |
| 2010/0184253 A1 | 7/2010 | Hirai et al. |
| 2010/0267198 A1 | 10/2010 | Yabuta et al. |
| 2010/0301328 A1 | 12/2010 | Yamazaki et al. |
| 2011/0014745 A1* | 1/2011 | Miyanaga .......... H01L 27/1225 438/104 |

(56) References Cited

U.S. PATENT DOCUMENTS

| | | |
|---|---|---|
| 2011/0227139 A1 | 9/2011 | Kakehata et al. |
| 2012/0015504 A1 | 1/2012 | Sasaki et al. |
| 2012/0071005 A1 | 3/2012 | Shimizu |

FOREIGN PATENT DOCUMENTS

| | | |
|---|---|---|
| EP | 1737044 A | 12/2006 |
| EP | 2020686 A | 2/2009 |
| EP | 2151853 A | 2/2010 |
| EP | 2175492 A | 4/2010 |
| EP | 2226847 A | 9/2010 |
| EP | 2339639 A | 6/2011 |
| EP | 2816607 A | 12/2014 |
| JP | 60-160127 A | 8/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 08-264794 A | 10/1996 |
| JP | 08-316143 A | 11/1996 |
| JP | 10-041515 A | 2/1998 |
| JP | 10-083990 A | 3/1998 |
| JP | 11-505377 | 5/1999 |
| JP | 11-354067 A | 12/1999 |
| JP | 2000-024445 A | 1/2000 |
| JP | 2000-044236 A | 2/2000 |
| JP | 2000-124463 A | 4/2000 |
| JP | 2000-150900 A | 5/2000 |
| JP | 2001-168029 A | 6/2001 |
| JP | 2001-345450 A | 12/2001 |
| JP | 2002-058995 A | 2/2002 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-015034 A | 1/2004 |
| JP | 2004-103957 A | 4/2004 |
| JP | 2004-207493 A | 7/2004 |
| JP | 2004-273614 A | 9/2004 |
| JP | 2004-273732 A | 9/2004 |
| JP | 2006-120382 A | 5/2006 |
| JP | 2006-165531 A | 6/2006 |
| JP | 2007-073559 A | 3/2007 |
| JP | 2007-073705 A | 3/2007 |
| JP | 2007-096055 A | 4/2007 |
| JP | 2007-103918 A | 4/2007 |
| JP | 2007-123861 A | 5/2007 |
| JP | 2007-250983 A | 9/2007 |
| JP | 2007-258286 A | 10/2007 |
| JP | 2008-004929 A | 1/2008 |
| JP | 2008-251657 A | 10/2008 |
| JP | 2008-281988 A | 11/2008 |
| JP | 2008-306176 A | 12/2008 |
| JP | 2009-004733 A | 1/2009 |
| JP | 2009-071163 A | 4/2009 |
| JP | 2009-130180 A | 6/2009 |
| JP | 2010-040552 A | 2/2010 |
| TW | I225105 | 12/2004 |
| WO | WO-2004/114391 | 12/2004 |
| WO | WO-2007/029844 | 3/2007 |
| WO | WO-2007/119386 | 10/2007 |
| WO | WO-2007/138937 | 12/2007 |
| WO | WO-2007/139009 | 12/2007 |
| WO | WO-2008/126879 | 10/2008 |
| WO | WO-2008/143304 | 11/2008 |
| WO | WO-2008/146575 | 12/2008 |
| WO | WO-2009/016778 | 2/2009 |
| WO | WO-2009/081796 | 7/2009 |
| WO | WO-2009/081968 | 7/2009 |

OTHER PUBLICATIONS

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—$ZnO$ system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—$ZnO$ System", Journal of Solid State Chemistry, Apr. 1, 1995, vol. 116, No. 1, pp. 170-178.

Nakamura.M et al., "Syntheses and crystal structures of new homologous compounds, indium iron zinc oxides ($InFeO_3(ZnO)_m$) (m natural number) and related compounds", Kotai Butsuri (Solid State Physics), 1993, vol. 28, No. 5, pp. 317-327.

Nomura.K et al., "Thin-Film Transistor Fabricated in Single-Crystalline Transparent Oxide Semiconductor", Science, May 23, 2003, vol. 300, No. 5623, pp. 1269-1272.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

Ohara.H et al., "Amorphous In—Ga—Zn-Oxide TFTs with Suppressed Variation for 4.0 inch Qvga AMOLED Display", AM-FPD '09 Digest of Technical Papers, Jul. 1, 2009, pp. 227-230, the Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

(56) References Cited

OTHER PUBLICATIONS

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic film and its bending properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for display applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

International Search Report (Application No. PCT/JP2010/061293) dated Aug. 3, 2010.

Written Opinion (Application No. PCT/JP2010/061293) dated Aug. 3, 2010.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of SOL-GEL-Derived Zinc Oxide Films by Irradiation With Ultraviolet Lamp", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Nakamura.M, "Synthesis of Homologous Compound with New Long-Period Structure", NIRIM Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

(56) References Cited

OTHER PUBLICATIONS

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Taiwanese Office Action (Application No. 099121255) dated May 14, 2015.

* cited by examiner

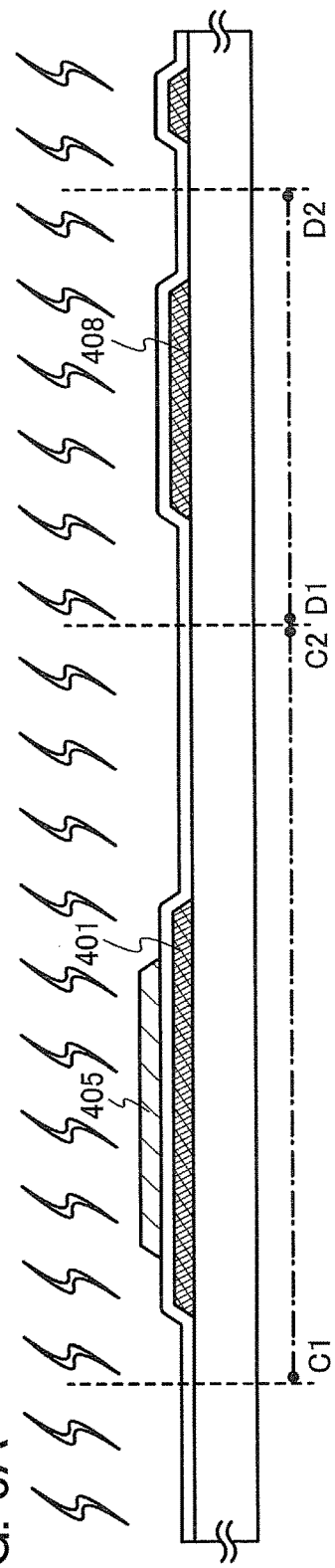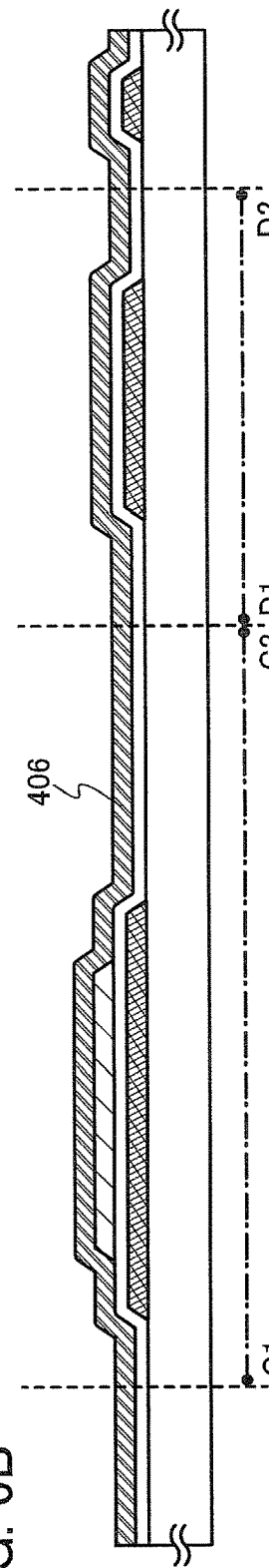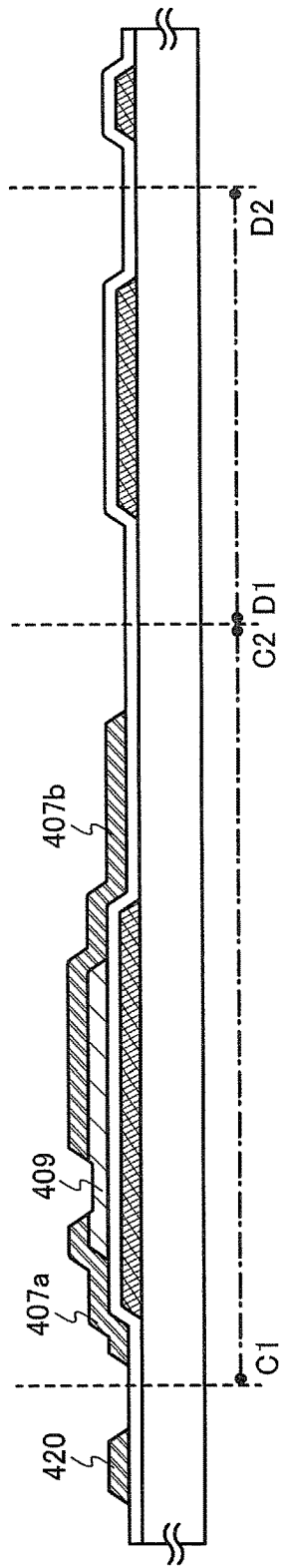

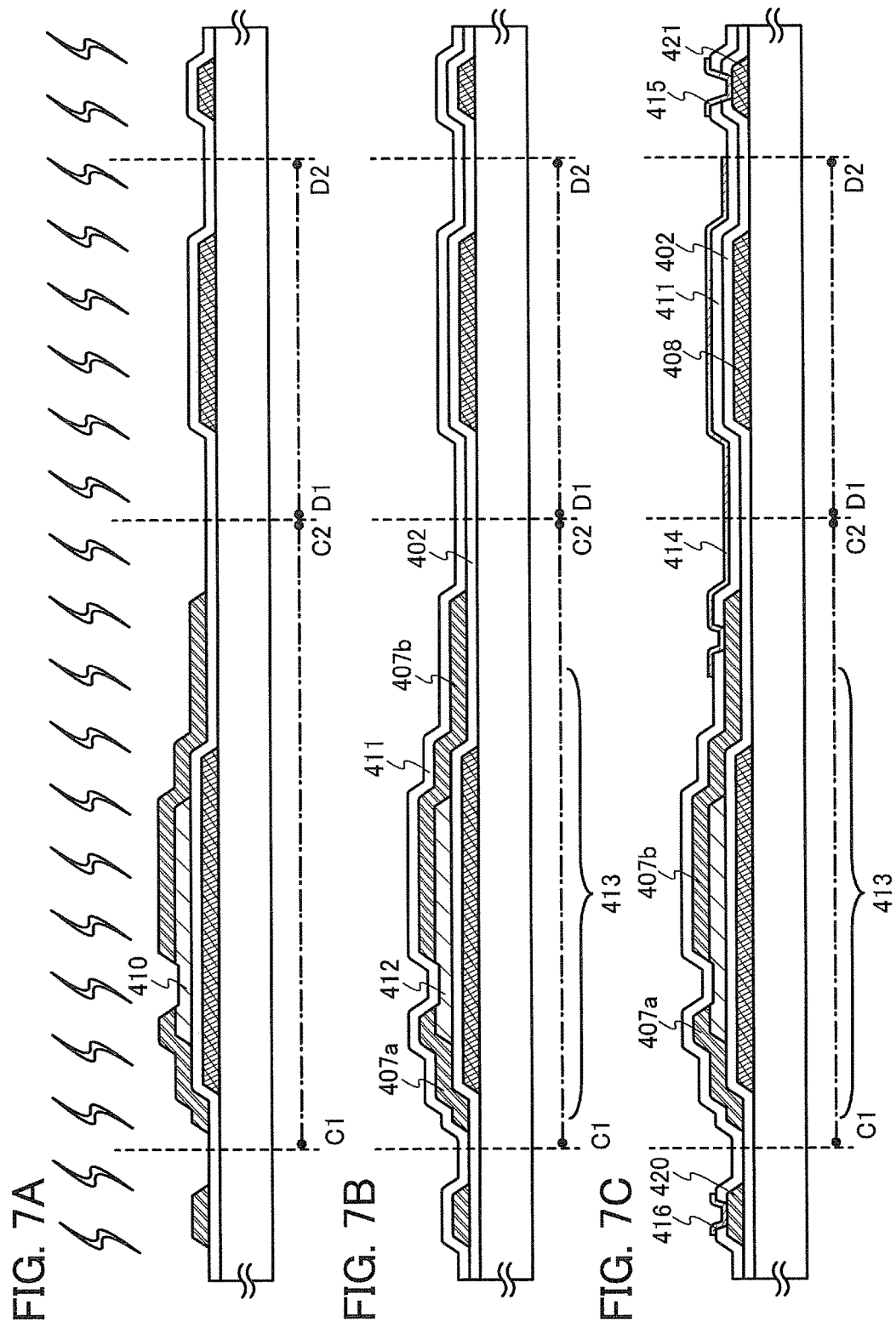

Absorption Curve

Dielectric Loss Curve

METHOD OF MANUFACTURING SEMICONDUCTOR DEVICE

TECHNICAL FIELD

The present invention relates to a method for manufacturing a semiconductor device including an oxide semiconductor.

BACKGROUND ART

Thin film transistors (TFTs) are one of field effect transistors and include a semiconductor film with a thickness of approximately several to several hundreds of nanometers, which is formed over an insulating surface, as an active layer. The thin film transistors are widely applied to flat panel displays such as liquid crystal display devices and light-emitting devices and electronic devices such as integrated circuits (ICs).

In recent years, transistors including a metal oxide as an active layer as well as silicon or germanium have developed. The metal oxide is used for various applications. For example, indium oxide is a well-known metal oxide and used as a material of a transparent electrode included in a liquid crystal display device or the like. Some metal oxides have semiconductor characteristics and are called oxide semiconductors. The examples of such metal oxides having semiconductor characteristics are a tungsten oxide, a tin oxide, an indium oxide, a zinc oxide, and the like. A transistor in which a channel formation region is formed using such a metal oxide having semiconductor characteristics is known (Patent Documents 1 to 4 and Non-Patent Document 1).

As metal oxides, not only single-component oxides but also multi-component oxides are known. For example, $InGaO_3(ZnO)_m$ (m is natural number) having a homologous phase is known as a multi-component oxide semiconductor including In, Ga, and Zn (Non-Patent Documents 2 to 4). Furthermore, it is confirmed that an oxide semiconductor including such an In—Ga—Zn-based oxide is applicable to a channel layer of a transistor (Patent Document 5 and Non-Patent Documents 5 and 6).

REFERENCES

Patent Documents

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957

Non-Patent Documents

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68, pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178
[Non-Patent Document 4] M. Nakamura, N. Kimizuka, T. Mohri, and M. Isobe, "Syntheses and crystal structures of new homologous compound, indium iron zinc oxides ($InFeO_3(ZnO)_m$ (m: natural number) and related compounds", *KOTAI BUTSURI (SOLID STATE PHYSICS)*, 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432, pp. 488-492

It is an object to provide a method for manufacturing a highly reliable semiconductor device including a transistor with stable electric characteristics.

In a method for manufacturing a semiconductor device including a transistor in which a channel formation region is formed using an oxide semiconductor, irradiation with an electromagnetic wave such as a microwave or a high frequency is performed to reduce impurities including a polar molecule such as moisture in an oxide semiconductor film and increase purity of the oxide semiconductor film. Further, irradiation with an electromagnetic wave is performed to reduce impurities such as moisture which exists in a gate insulating film as well as an oxide semiconductor film and to reduce impurities such as moisture which exists at interfaces between the oxide semiconductor film and upper and lower films provided in contact therewith.

Specifically, in order to reduce impurities such as moisture, after the formation of the oxide semiconductor film, the oxide semiconductor film is irradiated with an electromagnetic wave with a frequency which is easily absorbed into water (the frequency of a microwave is greater than or equal to 300 MHz and less than or equal to 3 THz, and the frequency of a high frequency is greater than or equal to 1 MHz and less than or equal to 300 MHz) under a nitrogen atmosphere, an inert gas atmosphere such as a rare gas (for example, argon or helium) atmosphere, or reduced pressure while the oxide semiconductor film is exposed. As a result, moisture included in the oxide semiconductor film is reduced. Note that it can be considered that since the oxide semiconductor film also include hydrogen and OH, desorption of hydrogen and OH from the oxide semiconductor film is caused by the irradiation with an electromagnetic wave.

Irradiation of the oxide semiconductor film with an electromagnetic wave and heat treatment may be performed at the same time. When the irradiation with an electromagnetic wave is performed at the same time as the heat treatment, impurities such as moisture in the oxide semiconductor film can be reduced more effectively in a short time. Note that the heat treatment is performed at a temperature where a metal having a low melting point such as Zn included in the oxide semiconductor is evaporated as less as possible, for example, higher than or equal to 100° C. and lower than 350° C., preferably higher than or equal to 150° C. and lower than 250° C. Note that even when the oxide semiconductor film is irradiated with an electromagnetic wave at room temperature, a water molecule absorbs electromagnetic wave energy and vibrates. Thus, it can be expected that the temperature of the oxide semiconductor film becomes higher than room temperature as a result. When the heat treatment is performed at the same time as the irradiation with an electromagnetic wave, the temperature of the oxide semiconductor film is desirably controlled in consideration of the amount of increase in the temperature due to the irradiation with an electromagnetic wave. Moreover, when the irradiation with an electromagnetic wave is performed in combination with the heat treatment, the temperature of the oxide semiconductor film is increased to the heat treatment temperature and then the irradiation with an electromagnetic wave is performed. After that, the oxide semiconductor film is slowly cooled to a temperature ranging from higher than or equal to room temperature and lower than 100° C.

In order to remove impurities such as moisture which exists in an oxide semiconductor film only by heat treatment in a short time, it is more effective to heat the oxide semiconductor film to a temperature higher than the above temperature range. However, according to an embodiment of the present invention, with the irradiation with an electromagnetic wave, impurities such as moisture can be removed effectively in a short time even at a temperature within the above temperature range or a temperature lower than the above temperature range. Therefore, the composition ratio of the oxide semiconductor can be prevented from changing due to evaporation of a metal having a low melting point such as Zn in removal of impurities such as moisture, and thus deterioration in characteristics of the transistor manufactured using the oxide semiconductor can be prevented.

An oxide semiconductor highly purified by desorption of impurities such as moisture, hydrogen, or OH which serves as an electron donor (donor) (a purified OS) is an intrinsic semiconductor (an i-type semiconductor) or a substantially intrinsic semiconductor. When the above oxide semiconductor is included in a transistor, deterioration in characteristics of the transistor due to impurities, for example, variation in the threshold voltage, can be prevented, which can improve reliability.

Moreover, after the oxide semiconductor film is irradiated with an electromagnetic wave to remove impurities such as moisture, an oxide insulating film may be formed in contact with the oxide semiconductor film. With the above structure, oxygen is supplied to an oxide semiconductor film even when an oxygen vacancy occurs in the oxide semiconductor film due to irradiation with an electromagnetic wave or heat treatment performed at the same time as the irradiation with an electromagnetic wave. Therefore, a vacancy of oxygen serving as a donor can be reduced in part of the oxide semiconductor film, which is in contact with the oxide insulating film, and thus the stoichiometric proportion can be satisfied. As a result, an oxide semiconductor film can be made to be an intrinsic semiconductor film or a substantially intrinsic semiconductor film. Accordingly, electric characteristics of the transistor can be improved and variation in the electric characteristics thereof can be reduced.

Specifically, the concentration of hydrogen in the highly purified oxide semiconductor, which is measured by secondary ion mass spectrometry (SIMS), is $5 \times 10^{19}/cm^3$ or less, preferably $5 \times 10^{18}/cm^3$ or less, more preferably $5 \times 10^{17}/cm^3$ or less, still more preferably less than $1 \times 10^{16}/cm^3$. In addition, the carrier density of the oxide semiconductor film, which is measured by Hall effect measurement, is less than $1 \times 10^{14}/cm^3$, preferably less than $1 \times 10^{12}/cm^3$, more preferably less than $1 \times 10^{11}/cm^3$. Furthermore, the band gap of the oxide semiconductor is 2 eV or more, preferably 2.5 eV or more, more preferably 3 eV or more.

The analysis of the concentration of hydrogen in the oxide semiconductor film is described here. The concentrations of hydrogen in the oxide semiconductor film and a conductive film are measured by secondary ion mass spectrometry (SIMS). It is known that it is difficult to obtain data in the proximity of a surface of a sample or in the proximity of an interface between stacked films formed using different materials by the SIMS analysis in principle. Thus, in the case where distributions of the hydrogen concentrations of the films in thickness directions are analyzed by SIMS, an average value in a region where the films are provided, the value is not greatly changed, and almost the same value can be obtained are employed as the hydrogen concentration. Further, in the case where the thickness of the film is small, a region where almost the same value can be obtained cannot be found in some cases due to the influence of the hydrogen concentration of the films adjacent to each other. In this case, the maximum value or the minimum value of the hydrogen concentration of a region where the films are provided is employed as the hydrogen concentration of the film. Furthermore, in the case where a mountain-shaped peak having the maximum value and a valley-shaped peak having the minimum value do not exist in the region where the films are provided, the value of the inflection point is employed as the hydrogen concentration.

As the oxide semiconductor, a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor, or a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, an In—Ga—O-based oxide semiconductor, an In—O-based oxide semiconductor, a Sn—O-based oxide semiconductor, and a Zn—O-based oxide semiconductor and be used. Note that in this specification, for example, an In—Sn—Ga—Zn—O-based oxide semiconductor means a metal oxide including indium (In), tin (Sn), gallium (Ga), and zinc (Zn). There is no particular limitation on the stoichiometric proportion. The above oxide semiconductor may include silicon.

Moreover, oxide semiconductors can be represented by the chemical formula, $InMO_3(ZnO)_m$ (m>0). Here, M represents one or more metal elements selected from Ga, Al, Mn, and Co.

Note that as the oxide insulating film formed in contact with the oxide semiconductor film, an inorganic insulating film which blocks entry of impurities such as moisture, a hydrogen ion, and OH$^-$, specifically, a silicon oxide film or a silicon nitride oxide film is used.

Moreover, after the oxide insulating film is formed in contact with the oxide semiconductor film, irradiation with an electromagnetic wave may be performed again. When irradiation with an electromagnetic wave is performed again after the oxide insulating film is formed in contact with the oxide semiconductor film, variation in electric characteristics of the transistor can be reduced.

A transistor having stable electric characteristics can be manufactured and provided. In addition, a semiconductor device which includes a highly reliable transistor having favorable electric characteristics can be provided.

BRIEF DESCRIPTION OF DRAWINGS

In the accompanying drawings:

FIGS. 6A to 6C are views illustrating a method for manufacturing a semiconductor device;

FIGS. 7A to 7C are views illustrating a method for manufacturing a semiconductor device;

Embodiments of the present invention will be described below with reference to the accompanying drawings. Note that the present invention is not limited to the following description of the embodiments, and it is readily appreciated by those skilled in the art that modes and details of the present invention can be modified in a variety of ways without departing from the spirit and scope of the present invention. Accordingly, the present invention should not be interpreted as being limited to the following description of the embodiments.

The present invention can be applied to manufacture of any kind of semiconductor devices including microprocessors, integrated circuits such as image processing circuits, RF tags, semiconductor display devices, and the like. A semiconductor device means any device which can function by utilizing semiconductor characteristics, and a semiconductor display device, a semiconductor circuit, and an electronic device are all included in the category of the semiconductor device. The semiconductor display devices include the following in its category: liquid crystal display devices, light-emitting devices in which a light-emitting element typified by an organic light-emitting element (OLED) is provided for each pixel, digital micromirror devices (DMDs), plasma display panels (PDPs), field emission displays (FEDs), and other semiconductor display devices in which a circuit element using a semiconductor film is included in a driver circuit.

EMBODIMENT 1

A method for manufacturing a semiconductor device is described with reference to FIGS. 1A to 1E and FIG. 2.

Figure 1A:
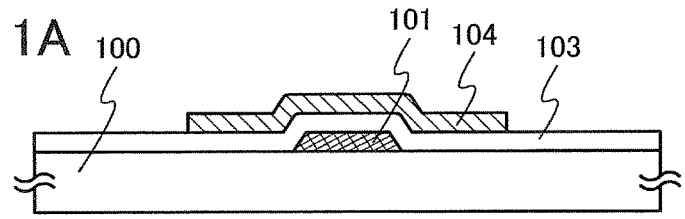
FIGS. 1A to 1E are views illustrating a method for manufacturing a semiconductor device.

As illustrated in FIG. 1A, a gate electrode 101 is provided over a substrate 100 having an insulating surface. An insulating film serving as a base film may be provided between the substrate 100 and the gate electrode 101. The base film can be formed to have a single layer or a stacked layer using one or more of insulating films which prevent diffusion of impurity elements from the substrate 100, specifically, a silicon nitride film, a silicon oxide film, a silicon nitride oxide film, or a silicon oxynitride film. The gate electrode 101 can be formed with a single layer or a stacked layer using one or more of conductive films using a metal material such as molybdenum, titanium, chromium, tantalum, tungsten, aluminum, copper, neodymium, or scandium, or an alloy material which includes any of these materials as a main component.

For example, as a two-layer structure of the gate electrode 101, the following structures are preferable: a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, and a two-layer structure in which a titanium nitride film and a molybdenum film are stacked. Further, as a three-layer structure, it is preferable to stack a tungsten film or a tungsten nitride film, an alloy film of aluminum and silicon or an alloy film of aluminum and titanium, and a titanium nitride film or a titanium film.

In this specification, oxynitride refers to a substance which includes more oxygen than nitrogen, and nitride oxide refers to a substance which includes more nitrogen than oxygen. For example, silicon oxynitride is a substance including oxygen, nitrogen, silicon, and hydrogen at concentrations ranging from 50 atomic % to 70 atomic %, 0.5 atomic % to 15 atomic %, 25 atomic % to 35 atomic %, and 0.1 atomic % to 10 atomic %, respectively. Further, silicon nitride oxide is a substance which includes oxygen, nitrogen, silicon, and hydrogen at concentrations ranging from 5 atomic % to 30 atomic %, 20 atomic % to 55 atomic %, 25 atomic % to 35 atomic %, and 10 atomic % to 30 atomic %, respectively. Note that the above concentration ranges are obtained when measurements are performed using Rutherford backscattering spectrometry (RBS) or hydrogen forward scattering (HFS). In addition, the total of the percentages of the constituent elements does not exceed 100 atomic %.

Next, a gate insulating film 103 is formed over the gate electrode 101. The gate insulating film 103 can be formed using a single layer or a stacked layer selected from a silicon oxide film, a silicon nitride film, a silicon oxynitride film, and a silicon nitride oxide film by a plasma CVD method, a sputtering method, or the like. For example, a silicon oxynitride film may be formed using a deposition gas including silane (for example, monosilane), oxygen, and nitrogen by a plasma CVD method.

Next, an oxide semiconductor film is formed over the gate insulating film 103. Note that before the oxide semiconductor film is formed by a sputtering method, dust attached to a surface of the gate insulating film 103 is preferably removed by reverse sputtering in which an argon gas is introduced and plasma is generated. The reverse sputtering refers to a method in which, without application of a voltage to a target side, an RF power source is used for application of a voltage to a substrate side for formation of plasma in proximity to the substrate under an argon atmosphere to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

An oxide semiconductor film for formation of a channel formation region can be formed using an oxide material having semiconductor characteristics, for example, an In—Ga—Zn—O-based non-single-crystal film. The oxide semiconductor film is formed by a sputtering method with use of an In—Ga—Zn—O-based oxide semiconductor target. Moreover, the oxide semiconductor film can be formed by a sputtering method under a rare gas (for example, argon) atmosphere, an oxygen atmosphere, or an atmosphere including a rare gas (for example, argon) and oxygen.

The gate insulating film 103 and the oxide semiconductor film may be formed successively without exposure to air. Successive film formation without exposure to air makes it possible to obtain each interface between stacked layers, which is not contaminated by atmospheric components or impurity elements floating in air, such as water, hydrocarbon, or the like. Therefore, variation in characteristics of the transistor can be reduced.

Figure 1B:
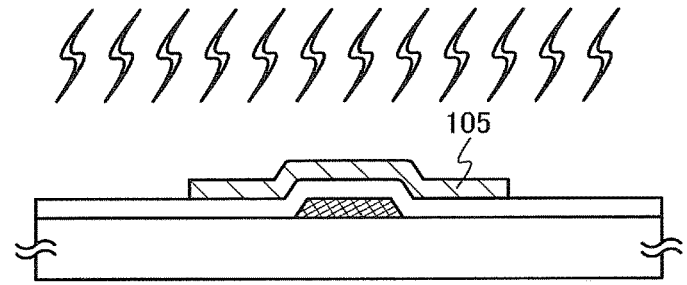

Next, the oxide semiconductor film is processed (patterned) into a desired shape by etching or the like to form an island-shaped oxide semiconductor film 104 (a first oxide semiconductor film). Note that it is found that the oxide semiconductor film formed by sputtering or the like includes large amount of impurities such as moisture or hydrogen. Moisture and hydrogen easily form a donor level and thus serve as impurities in the oxide semiconductor. Therefore, as illustrated in FIG. 1B, the island-shaped oxide semiconductor film 104 is irradiated with an electromagnetic wave such as a microwave or a high frequency under an inert gas (for example, nitrogen, helium, neon, or argon) atmosphere, an oxygen atmosphere, an ultra-dry air atmosphere, or reduced pressure to reduce impurities such as moisture or hydrogen which exists in the oxide semiconductor film, so that a highly purified island-shaped oxide semiconductor film 105 (a second oxide semiconductor film) is formed. It is desirable that the content of water in the gas be 20 ppm or less, preferably 1 ppm or less, and more preferably 10 ppb or less.

In the case where irradiation with a microwave is performed, the frequency of the microwave is greater than or equal 300 MHz and less than or equal to 3 THz, and preferably greater than or equal 300 MHz and less than or equal to 300 GHz. Further, in the case where irradiation with a high frequency is performed, the frequency of the high frequency is greater than or equal 1 MHz and less than or equal to 300 MHz, preferably greater than or equal 4 MHz and less than or equal to 80 MHz. In particular, the microwave with a frequency of 915 MHz or 2.45 GHz which is generally used for an electromagnetic wave generator such as a microwave oven easily resonates with a polarized water molecule. Thus, the microwave with the above frequency has a high water loss coefficient and thus is useful for effective desorption of water in the island-shaped oxide semiconductor film 104. For example, in the case of using an microwave with a frequency of 2.45 GHz, irradiation is performed for approximately five minutes under the condition of the output of 600 W. As a result, the highly purified island-shaped oxide semiconductor film 105 can be formed.

Figure 23:
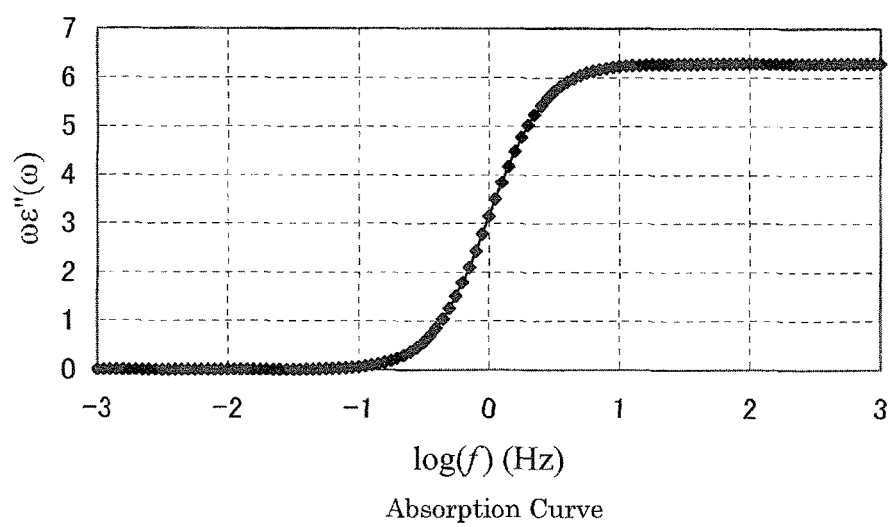
FIG. 23 is a graph showing an absorption curve of water with respect to a frequency of an electromagnetic wave in accordance with calculation results.
Figure 24:
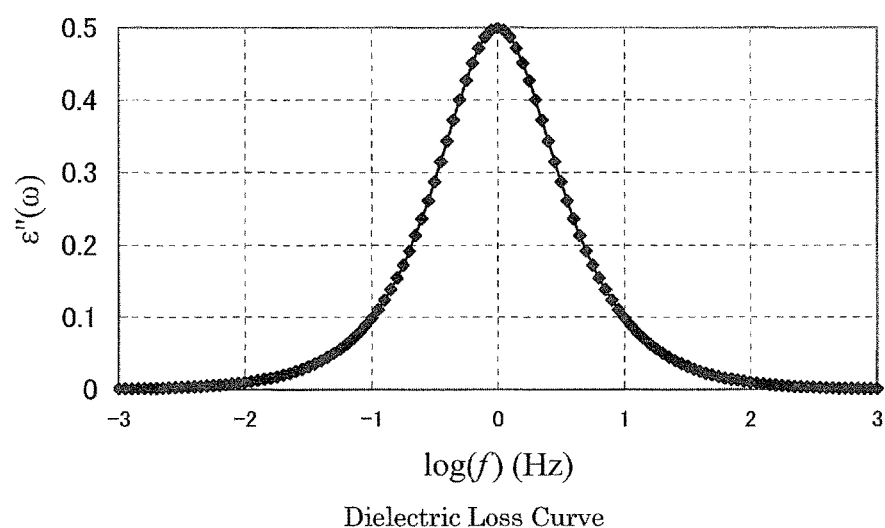
FIG. 24 is a graph showing dielectric loss of water with respect to a frequency of an electromagnetic wave in accordance with calculation results.

The effect of using a microwave is that water is uniformly and rapidly heated with the use of the heating effect of the microwave, which causes a chemical reaction which is different from that in so-called general heating. The molecular motion which occurs in a microwave region is a random motion in which molecules rotate and diffuse, which leads to heating effects. On the other hand, it is needless to say that there are also nonthermal effects. The dielectric relaxation characterizing water occurs at approximately 25 GHz. When the complex dielectric constant is $\varepsilon^* = \varepsilon - i\varepsilon''$, an imaginary part $\varepsilon''$ is called dielectric loss. When irradiation with an electromagnetic wave with a frequency where the value of the imaginary part $\varepsilon''$ is not zero is performed, the electromagnetic wave is absorbed into a dielectric. The frequency of the microwave oven is 2.4 GHz which is smaller than that in the peak of the dielectric loss of water by approximately one digit. The peak of the dielectric loss of water expands from several GHz or lower, which is lower part, to an ultraviolet region, which is higher part. Thus, the electromagnetic wave in this region is absorbed into water and the temperature of water can be increased. In the microwave oven, heating is performed by giving energy at the base of the lower value of the dielectric loss of water. It is known that water is represented by Debye relaxation. FIG. 23 shows an absorption curve in the case of using Debye relaxation. In FIG. 23, the horizontal axis represents the logarithm of the frequency (f) of the electromagnetic wave, and the vertical axis represents the value obtained by multiplying a dielectric loss (an imaginary part $\varepsilon''$) by an angular frequency $\omega$. FIG. 24 shows a dielectric loss of a frequency of the corresponding electromagnetic wave. The value of the absorption curve with a frequency in the peak of the dielectric loss is approximately half the maximum value. The absorption coefficient is saturated at the base of a loss spectrum on a high frequency side. It can be found that power with a frequency with which the absorption curve shown in FIG. 23 is somewhat large is preferably applied in consideration of effective heating.

Irradiation with a microwave can be performed in a treatment chamber where an inner wall is formed using a metal which can reflect the microwave. In this case, the microwave is generated in the microwave generation unit using magnetron or the like and then introduced into the treatment chamber through a waveguide. After that, the microwave is used for irradiation of an object to be processed. The microwave can be freely conveyed to the treatment chamber, like the case of light because the wavelength of the microwave is shorter than that of a high frequency. The microwave which is not absorbed into the object to be processed and used for irradiation of the inner wall of the treatment chamber is diffusely reflected in the inner wall and thus likely to be absorbed into the object to be processed finally.

Irradiation with a high frequency can be performed in such a manner that an object to be processed is provided between a pair of electrodes in a treatment chamber, and a high-frequency voltage is applied between the electrodes with the use of a high-frequency generation circuit.

Note that it is preferable that water, hydrogen, or the like be not included in nitrogen or a rare gas such as helium, neon, or argon which is introduced into the treatment chamber. Specifically, nitrogen or a rare gas such as helium, neon, or argon which is introduced into the treatment chamber preferably has a purity of 6N (99.9999%) or higher, more preferably 7N (99.99999%) or higher (that is, the concentration of impurities is 1 ppm or lower, preferably 0.1 ppm or lower).

Alternatively, irradiation with an electromagnetic wave may be performed in air where the dew point under an atmospheric pressure is −60° C. or lower and the moisture content is small, instead of an inert gas atmosphere such as a nitrogen atmosphere or a rare gas atmosphere.

Desorption of moisture, hydrogen, or OH by irradiation with an electromagnetic wave such as a microwave or a high frequency is performed in such a manner that molecular association in water molecules included in an oxide semiconductor film, molecular association of hydrogen and an oxide semiconductor, molecular association of a hydroxyl group and an oxide semiconductor, or the like absorbs energy of the electromagnetic wave and vibrates to be cut. Therefore, the above molecular association can be cut more efficiently as compared to the case of performing external heating where heat is gradually conveyed from an outside of the oxide semiconductor film to an inside of the oxide semiconductor film through thermal conductivity or the like. Thus, moisture, hydrogen, or OH can be desorbed from the oxide semiconductor film while increase in the temperature of the oxide semiconductor film is suppressed.

In a transistor including the oxide semiconductor highly purified by desorption of moisture, hydrogen, OH, or the like as a channel formation region, deterioration in characteristics of the transistor due to impurities, for example, variation in the threshold voltage, can be suppressed, whereby high reliability can be obtained.

Moreover, heat treatment may be performed on the island-shaped oxide semiconductor film 104 at the same time as irradiation with an electromagnetic wave. In the case where heat treatment is performed in combination with irradiation with an electromagnetic wave, the irradiation with an electromagnetic wave is desirably performed in such a manner that after the temperature of the island-shaped oxide semiconductor film 104 is increased to a heat treatment temperature under an inert gas (for example, nitrogen, helium, neon, or argon) atmosphere, an oxygen atmosphere, an ultra-dry air atmosphere, or reduced pressure, and then the above irradiation with an electromagnetic wave is performed, and after that, the island-shaped oxide semiconductor film 104 is slowly cooled to a temperature ranging from higher than or equal to room temperature and lower than 100° C. In the case where heat treatment is performed under reduced pressure, the reduced pressure state is changed back to the atmospheric pressure state by supplying an inert gas after the heating, and then the island-shaped oxide semiconductor film 104 may be cooled under atmospheric pressure. It is desirable that the content of water in the gas be 20 ppm or less, preferably 1 ppm or less, and more preferably 10 ppb or less.

The heat treatment is performed at a temperature where a metal having a low melting point such as Zn included in the oxide semiconductor is evaporated as less as possible, for example, higher than or equal to 100° C. and lower than 350° C., preferably higher than or equal to 150° C. and lower than 250° C. When irradiation with an electromagnetic wave is performed at the same time as heat treatment, impurities such as moisture included in the oxide semiconductor film can be reduced more effectively in a short time.

Note that even when the oxide semiconductor film is irradiated with an electromagnetic wave at room temperature, a water molecule absorbs electromagnetic wave energy and vibrates. Thus, it can be expected that the temperature of the oxide semiconductor film becomes higher than room temperature as a result. When heat treatment is performed at the same time as irradiation with an electromagnetic wave, the temperature of the oxide semiconductor film is desirably controlled in consideration of the amount of increase in the temperature due to the irradiation with an electromagnetic wave.

Further, in the heat treatment, a heating method using an electric furnace or an instantaneous heating method such as a gas rapid thermal anneal (GRTA) method using a heated gas or a lamp rapid thermal anneal (LRTA) method using lamp light can be used. For example, in the case of performing heat treatment using an electric furnace, the temperature rise characteristics is preferably set at higher than or equal to 0.1° C./min and lower than or equal to 20° C./min and the temperature drop characteristics is preferably set at higher than or equal to 0.1° C./min and lower than or equal to 15° C./min.

The island-shaped oxide semiconductor film 105 after the heat treatment is preferably in an amorphous state, but may be partly crystallized.

Note that after the irradiation with an electromagnetic wave is performed on the oxide semiconductor film, heat treatment is performed on the oxide semiconductor film under an oxygen atmosphere, whereby impurities such as water included in the oxide semiconductor film can be removed. In addition, the heat treatment is performed under an oxygen atmosphere in order that the oxide semiconductor film may include excessive oxygen, whereby resistance thereof can be increased. The heat treatment is performed at a temperature where a metal having a low melting point such as Zn included in the oxide semiconductor is evaporated as less as possible, for example, higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. Alternatively, an oxygen gas which is introduced into a heat treatment apparatus preferably has a purity of 6N (99.9999%) or higher, more preferably 7N (99.99999%) or higher (that is, the concentration of impurities in oxygen is 1 ppm or lower, preferably 0.1 ppm or lower).

Next, a conductive film is formed over the gate insulating film 103 and the island-shaped oxide semiconductor film 105. The conductive film is formed using a material such as an element selected from aluminum, chromium, tantalum, titanium, manganese, magnesium, molybdenum, tungsten, zirconium, beryllium, and thorium; an alloy including one or more of these elements as a component; or the like.

Note that in the case where heat treatment is performed after the formation of the conductive film, the conductive film preferably has heat resistance enough to withstand the heat treatment. In the case of performing heat treatment after the formation of the conductive film, the conductive film is formed using the low-resistant conductive material in combination with aluminum because aluminum alone has problems of low heat resistance, being easily corroded, and the like. As the low-resistant conductive material which is combined with aluminum, the following material is preferably used: an element selected from titanium, tantalum, tungsten, molybdenum, chromium, neodymium, or scandium; an alloy including one or more of these elements as a component; a nitride including any of these elements as a component; or the like.

Figure 1C:
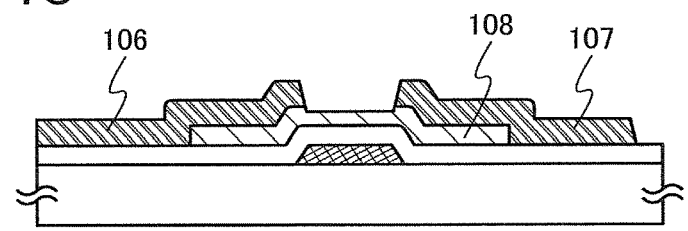

Next, as illustrated in FIG. 1C, the conductive film is processed (patterned) into a desired shape by etching or the like, thereby forming a source electrode 106 and a drain electrode 107. Note that in the patterning, the source electrode 106 and the drain electrode 107 are formed, so that part of the exposed portion of the island-shaped oxide semiconductor film is etched, whereby an island-shaped oxide semiconductor film 108 having a groove (a recessed portion) is formed.

Figure 1D:
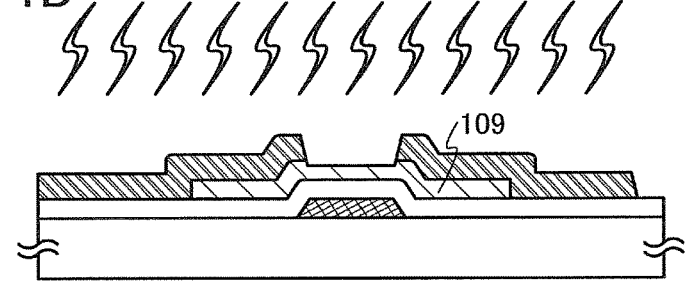

Then, as illustrated in FIG. 1D, the island-shaped oxide semiconductor film 108 is irradiated with an electromagnetic wave such as a microwave or a high frequency under an inert gas (for example, nitrogen, helium, neon, or argon) atmosphere, an oxygen atmosphere, an ultra-dry air atmosphere, or reduced pressure, whereby a highly purified island-shaped oxide semiconductor film 109 is formed. It is desirable that the content of water in the gas be 20 ppm or less, preferably 1 ppm or less, and more preferably 10 ppb or less. The description of the irradiation with an electromagnetic wave such as a microwave or a high frequency, which is performed on the island-shaped oxide semiconductor film 104, can be referred to for implementation of the irradiation with an electromagnetic wave such as a microwave or a high frequency, which is performed on the island-shaped oxide semiconductor film 108 and the heat treatment performed in combination with the irradiation with an electromagnetic wave.

According to an embodiment of the present invention, even when high-temperature heat treatment using irradiation with an electromagnetic wave is not performed, desorption of impurities such as water, hydrogen, or OH in an oxide semiconductor can be performed at a lower temperature in a shorter time. Therefore, a metal included in the source electrode 106 and the drain electrode 107 can be prevented from entering the island-shaped oxide semiconductor film 108 through heat treatment for desorption of impurities such as water, hydrogen, or OH, and deterioration in characteristics of the transistor, for example, off-state current can be prevented.

Moreover, in this embodiment, the island-shaped oxide semiconductor film 104 formed by patterning is irradiated with an electromagnetic wave. In addition, the island-shaped oxide semiconductor film 108 formed at the same time as the source electrode 106 and the drain electrode 107 are irradiated with an electromagnetic wave again. However, irradiation with an electromagnetic wave does not always need to be performed twice. Irradiation with an electromagnetic wave may be performed on either one of the island-shaped oxide semiconductor film 104 formed by patterning or the island-shaped oxide semiconductor film 108 formed at the same time as the source electrode 106 and the drain electrode 107. Alternatively, instead of the irradiation with an electromagnetic wave performed on the island-shaped oxide semiconductor film 104 formed by patterning, which is one of the two irradiation treatments with an electromagnetic wave, irradiation with an electromagnetic wave may be performed on the oxide semiconductor film before the formation of the island-shaped oxide semiconductor film 104 by patterning. Still alternatively, in addition to the two irradiation treatments with an electromagnetic wave, irradiation with an electromagnetic wave may be performed on the oxide semiconductor film before the formation of the island-shaped oxide semiconductor film 104 by patterning. Further still alternatively, irradiation with an electromagnetic wave may be performed only on the oxide semiconductor film before the formation of the island-shaped oxide semiconductor film 104 by patterning.

Figure 1E:
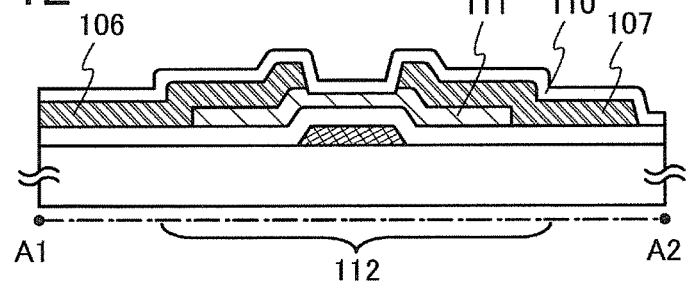

Next, as illustrated in FIG. 1E, an oxide insulating film 110 is formed in contact with the island-shaped oxide semiconductor film 109 by a sputtering method. The oxide insulating film 110 is formed in contact with the highly purified island-shaped oxide semiconductor film 109 and formed using an inorganic insulating film which includes impurities such as moisture, hydrogen, and OH as little as possible and blocks entry of these impurities from the outside, specifically, a silicon oxide film, a silicon nitride oxide film, or the like.

In this embodiment, a 300-nm-thick silicon oxide film is formed as the oxide insulating film 110. The substrate temperature in the film formation may be higher than or equal to room temperature and lower than or equal to 300° C., and is set at 100° C. in this embodiment. Formation of the silicon oxide film with a sputtering method can be performed under a rare gas (for example, argon) atmosphere, an oxygen atmosphere, or an atmosphere including a rare gas (for example, argon) and oxygen. Further, either a silicon oxide target or a silicon target may be used as a target. For example, the silicon oxide film can be formed by a sputtering method using a silicon target under an atmosphere including oxygen and nitrogen.

When the oxide insulating film 110 is formed in contact with the highly purified oxide semiconductor film 105 by a sputtering method, a PCVD method, or the like, oxygen is supplied to the oxide semiconductor film 105 even if oxygen vacancy occurs in the oxide semiconductor film 105 due to irradiation with an electromagnetic wave or heat treatment performed at the same time as the irradiation with an electromagnetic wave. Therefore, a vacancy of oxygen serving as a donor can be reduced in part of the oxide semiconductor film 105, which is in contact with the oxide insulating film 110, and thus the stoichiometric proportion can be satisfied. As a result, the oxide semiconductor film 105 can be made to be an intrinsic semiconductor film or a substantially intrinsic semiconductor film, so that an oxide semiconductor film 111 (a third oxide semiconductor film) can be formed. Accordingly, electric characteristics of the transistor can be improved and variation in the electric characteristics thereof can be reduced.

Figure 2:
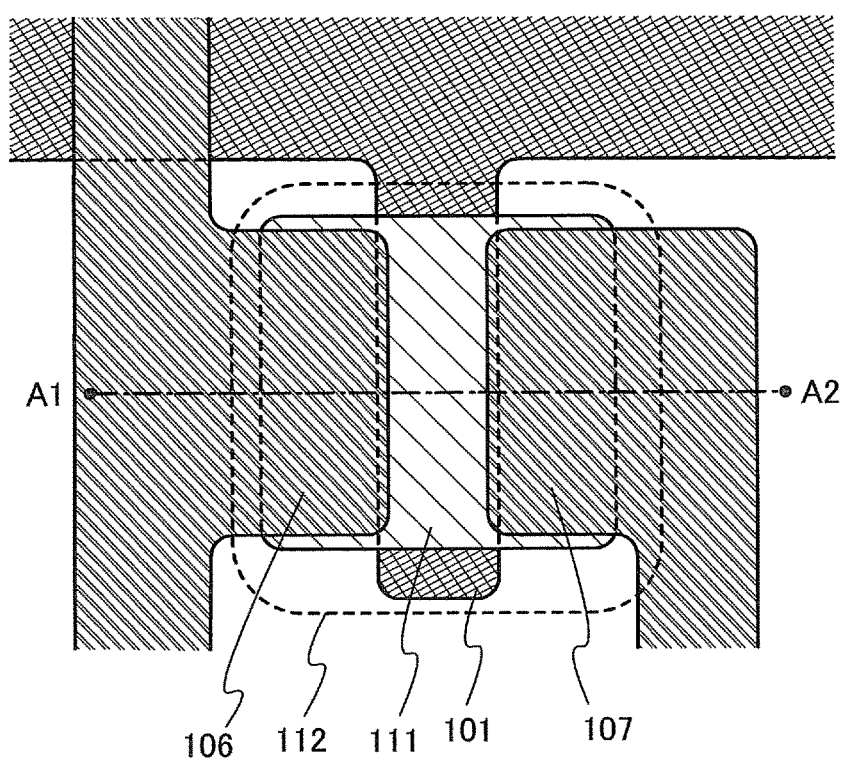
FIG. 2 is a top view of a manufactured transistor.

FIG. 2 is a top view of a transistor 112 manufactured in this embodiment. FIG. 1E is a cross-sectional view taken along dashed line A1-A2 in FIG. 2. The transistor 112 includes the gate electrode 101, the gate insulating film 103 over the gate electrode 101, the oxide semiconductor film 111 over the gate insulating film 103, and the source electrode 106 and the drain electrode 107 over the oxide semiconductor film 111.

Further, after the oxide insulating film 110 is formed, the transistor 112 may be subjected to heat treatment (preferably at higher than or equal to 150° C. and lower than 350° C.) under a nitrogen atmosphere or an air atmosphere (in air). For example, heat treatment is performed at 250° C. for one hour under a nitrogen atmosphere. By the heat treatment, the oxide semiconductor film 105 is heated while being in contact with the oxide insulating film 110. Accordingly, variation in electric characteristics of the transistor 112 can be reduced. There is no particular limitation on when to perform this heat treatment (preferably at higher than or equal to 150° C. and lower than 350° C.) as long as it is performed after the formation of the oxide insulating film 110. When this heat treatment also serves as heat treatment in another step, for example, heat treatment in formation of a resin film or heat treatment for reducing resistance of a transparent conductive film, the number of steps can be prevented from increasing.

Note that a step of forming the island-shaped oxide semiconductor film 109 by irradiating the island-shaped oxide semiconductor film 108 with an electromagnetic wave after forming the source electrode 106 and the drain electrode 107 and a step of forming the oxide insulating film 110 in contact with the oxide semiconductor film 109 are successively performed (also referred to as successive treatment or an insitu process) without exposure to air, whereby impurities such as moisture, hydrogen, or OH included in the oxide semiconductor film 111 which is finally formed can be further reduced. As a result, reliability of the transistor 112 can be more improved.

Note that in the manufacturing process, a step of forming the island-shaped oxide semiconductor film 109 by irradiating the island-shaped oxide semiconductor film 108 with an electromagnetic wave, a step of forming the oxide insulating film 110, a substrate transfer step, an alignment step, a heating or slow-cooling step, or the like may be included. Such a process is also within the scope of the successive processing in this specification. However, the following case is not within the scope of the successive treatment in this specification: there is a step in which liquid is used, such as a cleaning step, a wet etching step, or a resist formation step between the above two steps.

Figure 22:
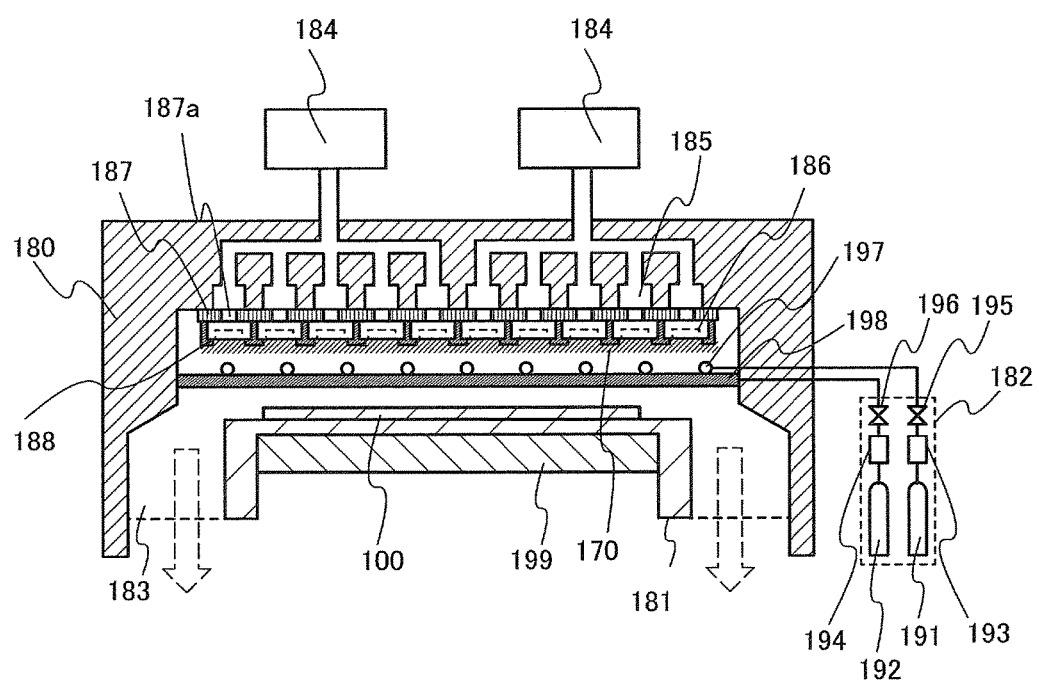
FIG. 22 is a cross-sectional view of a microwave plasma CVD apparatus.

The successive treatment can be performed by, for example, a microwave plasma CVD apparatus. FIG. 22 is a cross-sectional view illustrating a structure of a reaction chamber of a microwave plasma CVD apparatus. The reaction chamber of the microwave plasma CVD apparatus includes a treatment container 180, a support 181 which is provided in the treatment container 180 and on which the substrate 100 is disposed, a gas supply unit 182 for introducing a gas into the treatment container 180, an exhaust port 183 which is connected to a vacuum pump for exhausting a gas in the treatment container 180, a microwave generation unit 184 for supplying microwaves for generating plasma, a waveguide 185 for introducing the microwaves from the microwave generation unit 184 into the treatment container 180, a top plate 187 which is in contact with the waveguide 185 and has an opening 187a, and a plurality of dielectric plates 186 fixed to the top plate 187 with a fixing member 188.

Moreover, a gas pipe 197 through which a non-source gas flows and a gas pipe 198 through which a source gas flows are provided between the substrate 100 and the dielectric plate 186. The gas pipes 197 and 198 are connected to the gas supply unit 182. Specifically, the gas pipe 197 through which a non-source gas flows is connected to a non-source gas supply source 191 via a valve 195 and a mass flow controller 193. Further, the gas pipe 198 through which a source gas flows is connected to a non-source gas supply source 192 via a valve 196 and a mass flow controller 194. By provision of a temperature controller 199 for the support 181, the temperature of the substrate 100 can be controlled. A high-frequency power source may be connected to the support 181, so that predetermined bias voltage may be applied to the support 181 by high-frequency voltage output from the high-frequency power source. Note that the gas supply unit 182 and the microwave generation unit 184 are provided outside the reaction chamber.

The microwave generation unit 184 can supply microwaves with a frequency of 1 GHz, 2.45 GHz, or 8.3 GHz. By provision of the plurality of microwave generation units 184, irradiation with a microwave can be uniformly performed on a large-sized substrate with one side of over 1000 mm, and the highly uniform oxide insulating film 110 can be formed by a plasma CVD method at a high film-formation rate.

The treatment container 180 and the top plate 187 are formed of a metal whose surface is covered with an insulating film such as alumina, silicon oxide, or a fluorine resin, for example, an alloy including aluminum. In addition, the fixing member 188 is formed using a metal such as an alloy including aluminum.

The dielectric plate 186 is provided so as to be in close contact with the opening of the top plate 187. The microwaves generated in the microwave generation unit 184 are propagated to the dielectric plate 186 by passing through the waveguide 185 and the opening of the top plate 187 and transmitted through the dielectric plate 186 to be released into the treatment container 180.

The dielectric plate 186 is formed using ceramics such as sapphire, quartz glass, alumina, silicon oxide, or silicon nitride. The dielectric plate 186 may have a recessed portion on the side where a plasma 700 is generated. By the recessed portion, stable plasma can be generated. Irradiation with a microwave can be uniformly performed on a large-sized substrate with one side of over 1000 mm, and the highly uniform oxide insulating film 110 can be formed by a plasma CVD method at a high film-formation rate.

The gas pipe 197 through which a non-source gas flows and the gas pipe 198 through which a source gas flows are provided to intersect with each other. A nozzle of the gas pipe 197 through which a non-source gas flows is provided on the dielectric plate 186 side, and a nozzle of the gas pipe 198 through which a source gas flows is provided on the substrate 100 side. By release of the non-source gas to the dielectric plate 186 side, a plasma 170 can be generated while formation of the film on the surface of the dielectric plate 186 is prevented. Further, the source gas can be released at a position which is closer to the substrate 100, and a deposition rate can be increased. The gas pipes 197 and 198 are formed using ceramics such as alumina or aluminum nitride. Transmissivity of the microwaves is high in the ceramics; therefore, when the gas pipes 197 and 198 are formed using ceramics, distribution of the plasma can be uniform without an electric field being disturbed, even when the gas pipe is provided right under the dielectric plate 186.

In the case where irradiation with a microwave is performed using a microwave plasma CVD apparatus, after the inside of the treatment container 180 is made into a vacuum state, an inert gas such as nitrogen, helium, neon, or argon is introduced into the treatment container 180 from the non-source gas supply source 191. In the case where heat treatment is performed at the same time as the irradiation with a microwave, the temperature of the support 181 is controlled by the temperature controller 199 such that the temperature of the substrate 100 reaches to a predetermined temperature before the irradiation with a microwave. Note that by field effect energy of the microwaves released into the treatment container 180, the non-source gas is made into a plasma state. The plasma 170 has higher density on the surface of the dielectric plate 186; thus, damage to the substrate 100 can be reduced.

After the irradiation with a microwave, first, the temperature of the substrate 100 is controlled in order to form the oxide insulating film 110 using silicon oxide. The substrate 100 is at room temperature or heated by the temperature controller 199 to 100° C. to 350° C. Then, the inside of the treatment container 180 is made into a vacuum state, and one or more rare gases such as helium, argon, neon, xenon, and krypton, and an oxygen gas are introduced into the treatment container 180 in order to generate plasma. By introducing the oxygen gas together with the rare gas into the treatment container 180, plasma ignition can be facilitated.

Note that in the case where, at a step of irradiation with a microwave, helium, neon, or argon is already introduced into the treatment container 180, a gas in the treatment container 180 does not need to be changed in the formation of the oxide insulating film 110. Further, in the case where the irradiation with a microwave is performed at the same time as heat treatment, the temperature of the substrate 100 is not necessarily reduced after the heat treatment, and then a step of forming the oxide insulating film 110 may be performed.

The distance between the substrate 100 and the dielectric plate 186 is approximately 10 mm to 80 mm (preferably, 10 mm to 30 mm). The pressure in the treatment container 180 is set at predetermined pressure, 1 Pa to 200 Pa, preferably 1 Pa to 100 Pa. Then, the microwave generation unit 184 is turned on, and the microwaves are supplied from the microwave generation unit 184 to the waveguide 185, so that the plasma is generated in the treatment container 180. The output power of the microwave generation unit is set at 500 W to 6000 W, preferably 4000 W to 6000 W. By excitation of plasma by introducing the microwaves, plasma with low electron temperature (greater than or equal to 0.7 eV and less than or equal to 3 eV, preferably greater than or equal to 0.7 eV and less than or equal to 1.5 eV) and high electron density ($1 \times 10^{11}$ cm$^{-3}$ to $1 \times 10^{13}$ cm$^{-3}$) can be generated. Next, a source gas is introduced from the gas pipe 198 into the treatment container 180. Specifically, supply of the oxygen gas is halted, and silane and oxygen are introduced as a source gas, whereby the oxide insulating film 110 including silicon oxide can be formed over the substrate 100. Then, supply of the source gas is halted, the pressure in the treatment container 180 is lowered, and the microwave generation unit 184 is turned off.

Although FIG. 22 illustrates an example of a reaction chamber of a microwave plasma CVD apparatus, the microwave plasma CVD apparatus may include a plurality of reaction chambers, and the plurality of reaction chambers may be directly connected to each other or may be to a common chamber.

EMBODIMENT 2

In this embodiment, a method for manufacturing a semiconductor device including a transistor of which structure is different from that of the transistor 112 described in Embodiment 1 is described. Note that the same portions as Embodiment 1 or portions having functions similar to those of Embodiment 1 can be formed in a manner similar to that of Embodiment 1, and also the same steps as Embodiment 1 or the steps similar to those of Embodiment 1 can be performed in a manner similar to those of Embodiment 1; therefore, and repetitive description thereof is omitted.

A method for manufacturing a semiconductor device is described with reference to FIGS. 3A to 3D and FIG. 4.

Figure 3A:
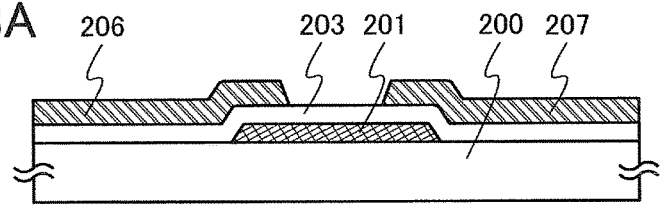
FIGS. 3A to 3D are views illustrating a method for manufacturing a semiconductor device.

As illustrated in FIG. 3A, a gate electrode 201 is provided over a substrate 200 having an insulating surface. An insulating film serving as a base film may be provided between the substrate 200 and the gate electrode 201. The descriptions of the material and the structure of the gate electrode 101 in Embodiment 1 may be referred to for details of the material and the structure of the gate electrode 201. The base film has a function of preventing diffusion of an impurity element from the substrate 200, and can be formed to have a single layer or stacked layer using one or more films selected from a silicon nitride film, a silicon oxide film, a silicon nitride oxide film, and a silicon oxynitride film.

Next, a gate insulating film 203 is formed over the gate electrode 201. The gate insulating film 203 can be formed to have a single layer or stacked layer using one or more films selected from a silicon oxide film, a silicon nitride film, a silicon oxynitride film, and a silicon nitride oxide film by a plasma CVD method, a sputtering method, or the like. For example, a silicon oxynitride film may be formed using a deposition gas including silane (for example, monosilane), oxygen, and nitrogen by a plasma CVD method Next, a conductive film is formed over the gate insulating film 203. Then, the conductive film is processed (patterned) into a desired shape by etching or the like, so that a source electrode 206 and a drain electrode 207 are formed. The description of the material of the conductive film patterned in the formation of the source electrode 106 and the drain electrode 107 in Embodiment 1 may be referred to for details of the material of the conductive film.

Figure 3B:
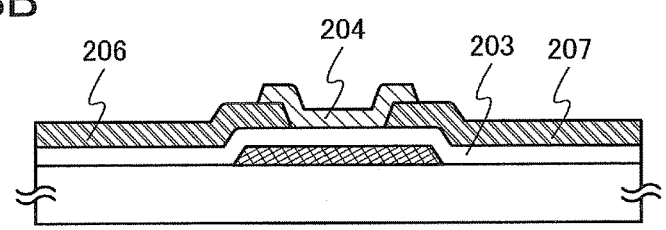

Next, an oxide semiconductor film is formed over the source electrode 206 and the drain electrode 207 and the gate insulating film 203. Then, as illustrated in FIG. 3B, the oxide semiconductor film is processed (patterned) into a desired shape by etching or the like, so that an island-shaped oxide semiconductor film 204 (a first oxide semiconductor film) is formed.

An oxide semiconductor film for forming a channel formation region may be formed using an oxide material having semiconductor characteristics described in Embodiment 1. The oxide semiconductor film can be formed by a sputtering method under a rare gas (for example, argon) atmosphere, an oxygen atmosphere, or an atmosphere including a rare gas (for example, argon) and oxygen. Note that before the oxide semiconductor film is formed by a sputtering method, dust attached to a surface of the gate insulating film 203 is preferably removed by reverse sputtering in which an argon gas is introduced and plasma is generated.

Figure 3C:
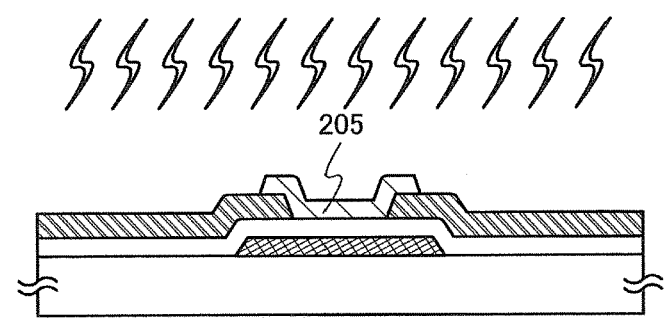

Next, as illustrated in FIG. 3C, the island-shaped oxide semiconductor film 204 is irradiated with an electromagnetic wave such as a microwave or a high frequency under an inert gas (for example, nitrogen, helium, neon, or argon) atmosphere, an oxygen atmosphere, an ultra-dry air atmosphere, or reduced pressure, so that moisture, hydrogen, or OH is desorbed. Thus, a highly purified island-shaped oxide semiconductor film 205 (a second oxide semiconductor film) is formed. It is desirable that the content of water in the gas be 20 ppm or less, preferably 1 ppm or less, and more preferably 10 ppb or less. Heat treatment may be performed on the island-shaped oxide semiconductor film 204 at the same time as the irradiation with an electromagnetic wave.

The descriptions of the irradiation with an electromagnetic wave and heat treatment performed on the oxide semiconductor film 104 in Embodiment 1 may be referred to for details of the irradiation with an electromagnetic wave and heat treatment performed on the oxide semiconductor film 204.

In a transistor including the oxide semiconductor highly purified by desorption of moisture, hydrogen, OH, or the like as a channel formation region, deterioration in characteristics of the transistor due to impurities, for example, variation in the threshold voltage, can be suppressed, whereby high reliability can be obtained.

In addition, according to an embodiment of the present invention, even when high-temperature heat treatment using irradiation with an electromagnetic wave is not performed, desorption of impurities such as water, hydrogen, or OH in an oxide semiconductor can be performed at a lower temperature in a shorter time. Therefore, a metal included in the source electrode 206 and the drain electrode 207 can be prevented from entering the island-shaped oxide semiconductor film 205 through heat treatment for desorption of impurities such as water, hydrogen, or OH, and deterioration in characteristics of the transistor, for example, off-state current can be prevented.

Moreover, although the irradiation with an electromagnetic wave is performed on the island-shaped oxide semiconductor film 204 formed by patterning in this embodiment, irradiation with an electromagnetic wave may be performed on the oxide semiconductor film not after patterning but before patterning. Alternatively, irradiation with an electromagnetic wave may be performed both before and after patterning.

Figure 3D:
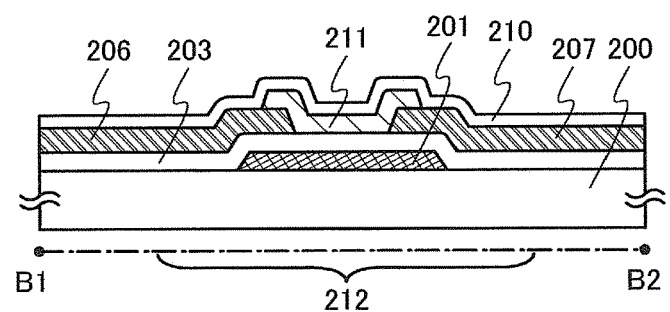

Next, as illustrated in FIG. 3D, an oxide insulating film 210 is formed in contact with the island-shaped oxide semiconductor film 205 by a sputtering method. The oxide insulating film 210 is formed in contact with the highly purified island-shaped oxide semiconductor film 205 and formed using an inorganic insulating film which includes impurities such as moisture, hydrogen, and OH as little as possible and blocks entry of these impurities from the outside, specifically, a silicon oxide film, a silicon nitride oxide film, or the like.

In this embodiment, a 300-nm-thick silicon oxide film is formed as the oxide insulating film 210. The substrate temperature in the film formation may be higher than or equal to room temperature and lower than or equal to 300° C., and is set at 100° C. in this embodiment. When the oxide insulating film 210 is formed in contact with the highly purified island-shaped oxide semiconductor film 205 by a sputtering method, a PCVD method, or the like, oxygen is supplied to the oxide semiconductor film 205 even when an oxygen vacancy occurs in the oxide semiconductor film 205 due to irradiation with an electromagnetic wave or heat treatment performed at the same time as the irradiation with an electromagnetic wave. Therefore, a vacancy of oxygen serving as a donor can be reduced in part of the oxide semiconductor film 205, which is in contact with the oxide insulating film 210, and thus the stoichiometric proportion can be satisfied. As a result, the oxide semiconductor film 205 can be made to be an intrinsic semiconductor film or a substantially intrinsic semiconductor film, so that an oxide semiconductor film 211 (a third oxide semiconductor film) can be formed. Accordingly, electric characteristics of the transistor can be improved and variation in the electric characteristics thereof can be reduced.

Figure 4:
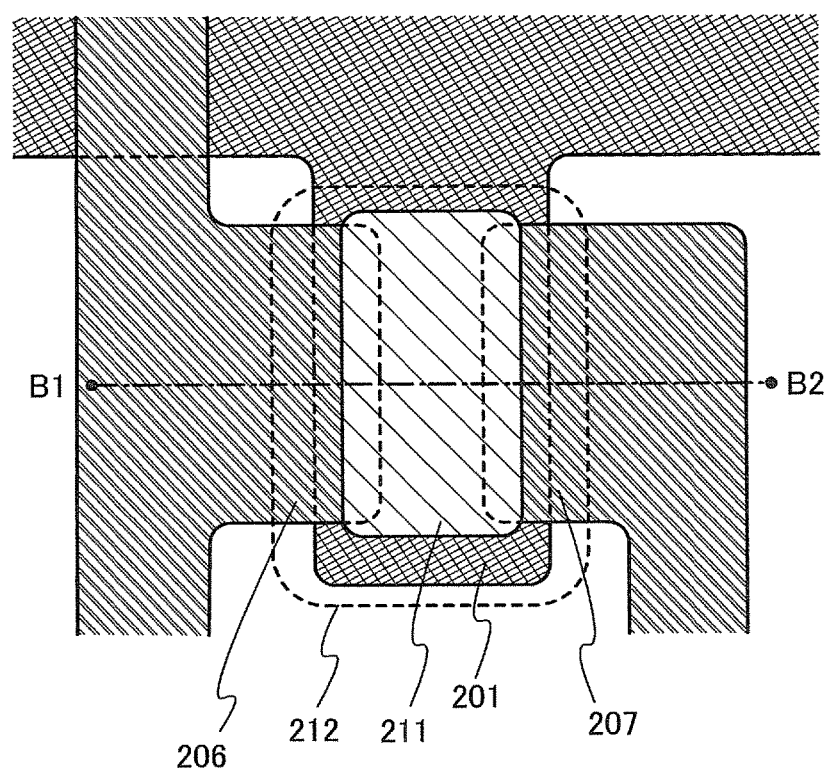
FIG. 4 is a top view of a manufactured transistor.

FIG. 4 is a top view of a transistor 212 manufactured in this embodiment. FIG. 3D is a cross-sectional view taken along dashed line B1-B1 in FIG. 4. The transistor 212 includes the gate electrode 201, the gate insulating film 203 over the gate electrode 201, the source electrode 206 and the drain electrode 207 over the gate insulating film 203, and the oxide semiconductor film 211 over the gate insulating film 203, and the source electrode 206 and the drain electrode 207.

Further, after the formation of the oxide insulating film 210, heat treatment may be performed on the transistor 212 under a nitrogen atmosphere or an air atmosphere (in air) (preferably at a temperature higher than or equal to 150° C. and lower than 350° C.). For example, heat treatment is performed under a nitrogen atmosphere at 250° C. for one hour. In such heat treatment, the oxide semiconductor film 205 in a condition being in contact with the oxide insulating film 210 is heated; thus, variation in electric characteristics of the transistor 212 can be reduced. There is no particular limitation on when to perform this heat treatment (preferably at higher than or equal to 150° C. and lower than 350° C.) as long as it is performed after the formation of the oxide insulating film 210. When this heat treatment also serves as heat treatment in another step, for example, heat treatment in formation of a resin film or heat treatment for reducing resistance of a transparent conductive film, the number of steps can be prevented from increasing.

Note that a step of forming the island-shaped oxide semiconductor film 205 by irradiating the island-shaped oxide semiconductor film 204 with an electromagnetic wave after forming the source electrode 206 and the drain electrode 207 and a step of forming the oxide insulating film 210 in contact with the oxide semiconductor film 205 are successively performed (also referred to as successive treatment or an insitu process) without exposure to air, whereby impurities such as moisture, hydrogen, or OH included in the oxide semiconductor film 205 which is finally formed can be further reduced. As a result, reliability of the transistor 212 can be more improved.

This embodiment can be freely combined with any of the other embodiments.

EMBODIMENT 3

A method for manufacturing a semiconductor device including a transistor is described with reference to FIGS. 5A to 5C, FIGS. 6A to 6C, FIGS. 7A to 7C, FIG. 8, FIG. 9, and FIG. 10.

Figure 5A:
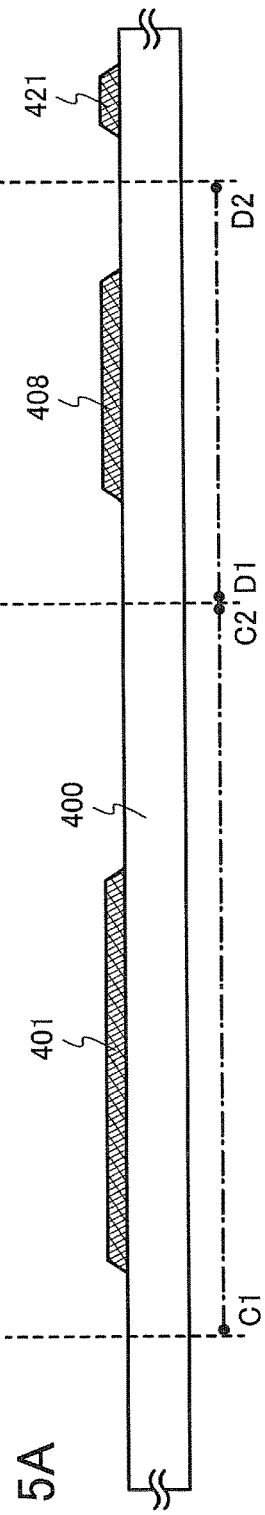
FIGS. 5A to 5C are views illustrating a method for manufacturing a semiconductor device.

In FIG. 5A, as a substrate 400 having a light-transmitting property, a glass substrate of barium borosilicate glass, aluminoborosilicate glass, or the like typified by 7059 glass, 1737 glass, or the like manufactured by Corning Incorporated can be used.

Next, a conductive layer is formed entirely over a surface of the substrate 400, and then a first photolithography step is performed in such a manner that a resist mask is formed and unnecessary portions are removed by etching, so that wirings and an electrode (a gate wiring including a gate electrode 401, a capacitor wiring 408, and a first terminal 421) are formed. At this time, the etching is performed so that at least end portions of the gate electrode 401 are tapered.

Each of the gate wiring including the gate electrode 401, the capacitor wiring 408, and the first terminal 421 in a terminal portion is preferably formed using a heat-resistant conductive material such as an element selected from titanium, tantalum, tungsten, molybdenum, chromium, neodymium, and scandium; an alloy including any of these elements as a component; an alloy film including a combination of any of the above elements; or a nitride including any of the above elements as a component.

Figure 5B:
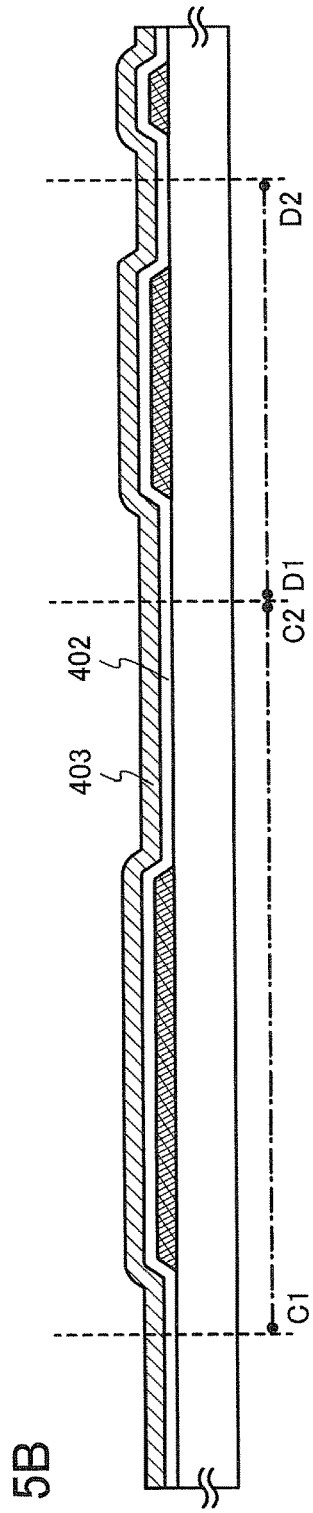

Next, a gate insulating film 402 is formed entirely over surfaces of the gate electrode 401, the capacitor wiring 408, the first terminal 421 as illustrated in FIG. 5B. The gate insulating film 402 is formed to a thickness of 50 nm to 250 nm by a sputtering method, a PCVD method, or the like.

For example, as the gate insulating film 402, a silicon oxide film is formed to a thickness of 100 nm by a sputtering method. Needless to say, the gate insulating film 402 is not limited to such a silicon oxide film and may be formed to have a single-layer structure or a stacked-layer structure using another insulating film such as a silicon oxynitride film, a silicon nitride film, an aluminum oxide film, or a tantalum oxide film.

Next, an oxide semiconductor film 403 (an In—Ga—Zn—O-based non-single-crystal film) is formed over the gate insulating film 402. The oxide semiconductor film 403 is formed without exposure to air after plasma treatment, which is advantageous in that dust or moisture is not attached to an interface between the gate insulating film 402 and the oxide semiconductor film 403. Here, the oxide semiconductor film 403 is formed under an oxygen atmosphere, an argon atmosphere, or an atmosphere including argon and oxygen using an oxide semiconductor target having a diameter of 8 inches and including In, Ga, and Zn (an In—Ga—Zn—O-based oxide semiconductor target ($In_2O_3:Ga_2O_3:ZnO=1:1:1$)), with the distance between the substrate 400 and the target set to 170 mm, under a pressure of 0.4 Pa, and with a direct current (DC) power source of 0.5 kW. Note that a pulse direct current (DC) power source is preferable because dust can be reduced and the film thickness can be uniform. The thickness of the In—Ga—Zn—O-based non-single-crystal film is set to 5 nm to 200 nm. In this embodiment, for example, as the oxide semiconductor film 403, an In—Ga—Zn—O-based non-single-crystal film is formed to a thickness of 50 nm by a sputtering method using an In—Ga—Zn—O-based oxide semiconductor target.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering method, and a sputtering apparatus used for an ECR sputtering method in which plasma generated with the use of microwaves is used without using glow discharge.

Furthermore, as a film formation method with a sputtering method, there are also a reactive sputtering method in which a target substance and a sputtering gas component are chemically reacted with each other during film formation to form a thin compound film thereof, and a bias sputtering method in which voltage is also applied to a substrate during film formation.

Figure 5C:
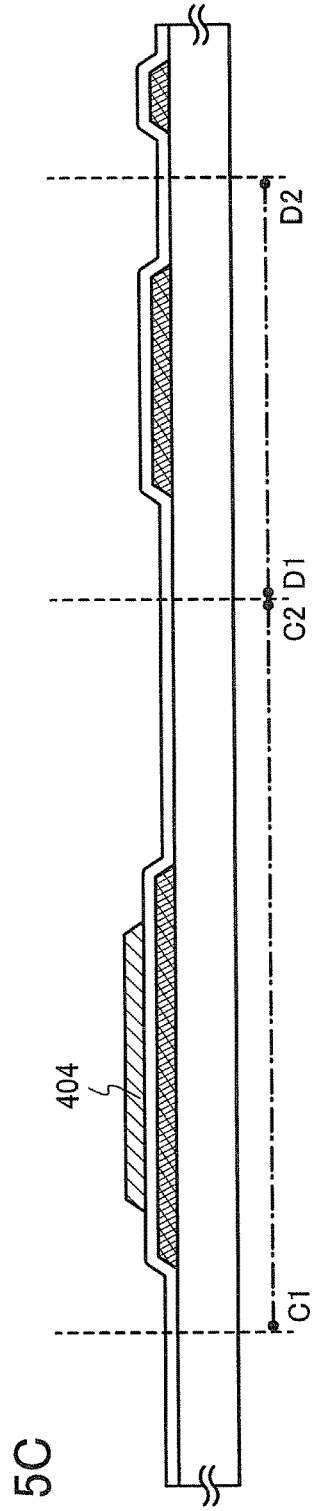

Next, as illustrated in FIG. 5C, a second photolithography step is performed in such a manner that a resist mask is formed and the oxide semiconductor film 403 is etched. For example, unnecessary portions are removed by wet etching using a mixed solution of phosphoric acid, acetic acid, and nitric acid, so that an island-shaped oxide semiconductor film 404 is formed so as to overlap with the gate electrode 401. Note that etching here is not limited to wet etching, and dry etching may also be performed.

As an etching gas for dry etching, a gas including chlorine (a chlorine-based gas such as chlorine ($Cl_2$), boron chloride ($BCl_3$), silicon chloride ($SiCl_4$), or carbon tetrachloride ($CCl_4$)) is preferably used.

Alternatively, a gas including fluorine (a fluorine-based gas such as carbon tetrafluoride (CFO, sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate reactive ion etching (RIE) method or an inductively coupled plasma (ICP) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a mixed solution of phosphoric acid, acetic acid, and nitric acid, or the like can be used. Alternatively, ITO-07N (produced by KANTO CHEMICAL CO., INC.) may be used.

Furthermore, the etchant after the wet etching is removed together with the etched material by cleaning. The waste liquid of the etchant including the material etched off may be purified and the material may be reused. When a material such as indium included in the oxide semiconductor film is collected from the waste liquid after the etching and reused, the resources can be efficiently used and the cost can be reduced.

In order to obtain a desired shape by etching, the etching conditions (such as an etchant, etching time, and temperature) are adjusted as appropriate depending on the material.

Next, as illustrated in FIG. 6A, the oxide semiconductor film 404 is irradiated with an electromagnetic wave under an inert gas (for example, nitrogen, helium, neon, or argon) atmosphere, an oxygen atmosphere, an ultra-dry air atmosphere, or reduced pressure. Heat treatment may be performed at the same time as the irradiation with an electromagnetic wave. It is desirable that the content of water in the gas be 20 ppm or less, preferably 1 ppm or less, and more preferably 10 ppb or less. Impurities such as moisture, hydrogen, or OH are desorbed by the irradiation with an electromagnetic wave, so that a highly purified oxide semiconductor film 405 is formed.

For example, the highly purified island-shaped oxide semiconductor film 405 can be formed in such a manner that irradiation is performed under a nitrogen atmosphere with a microwave of 2.45 GHz at 600 W for about 5 minutes. In the case where heat treatment is performed at the same time as the irradiation, the irradiation is performed at a temperature where a metal having a low melting point such as Zn included in the oxide semiconductor is evaporated as less as possible, for example, higher than or equal to 100° C. and lower than 350° C., preferably higher than or equal to 150° C. and lower than 250° C. When the irradiation with an electromagnetic wave is performed at the same time as the heat treatment, impurities such as moisture in the oxide semiconductor film can be reduced more effectively in a short time. In this case, the irradiation with an electromagnetic wave is performed in a state where the temperature of the substrate 400 reaches a heat treatment temperature.

Figure 8:
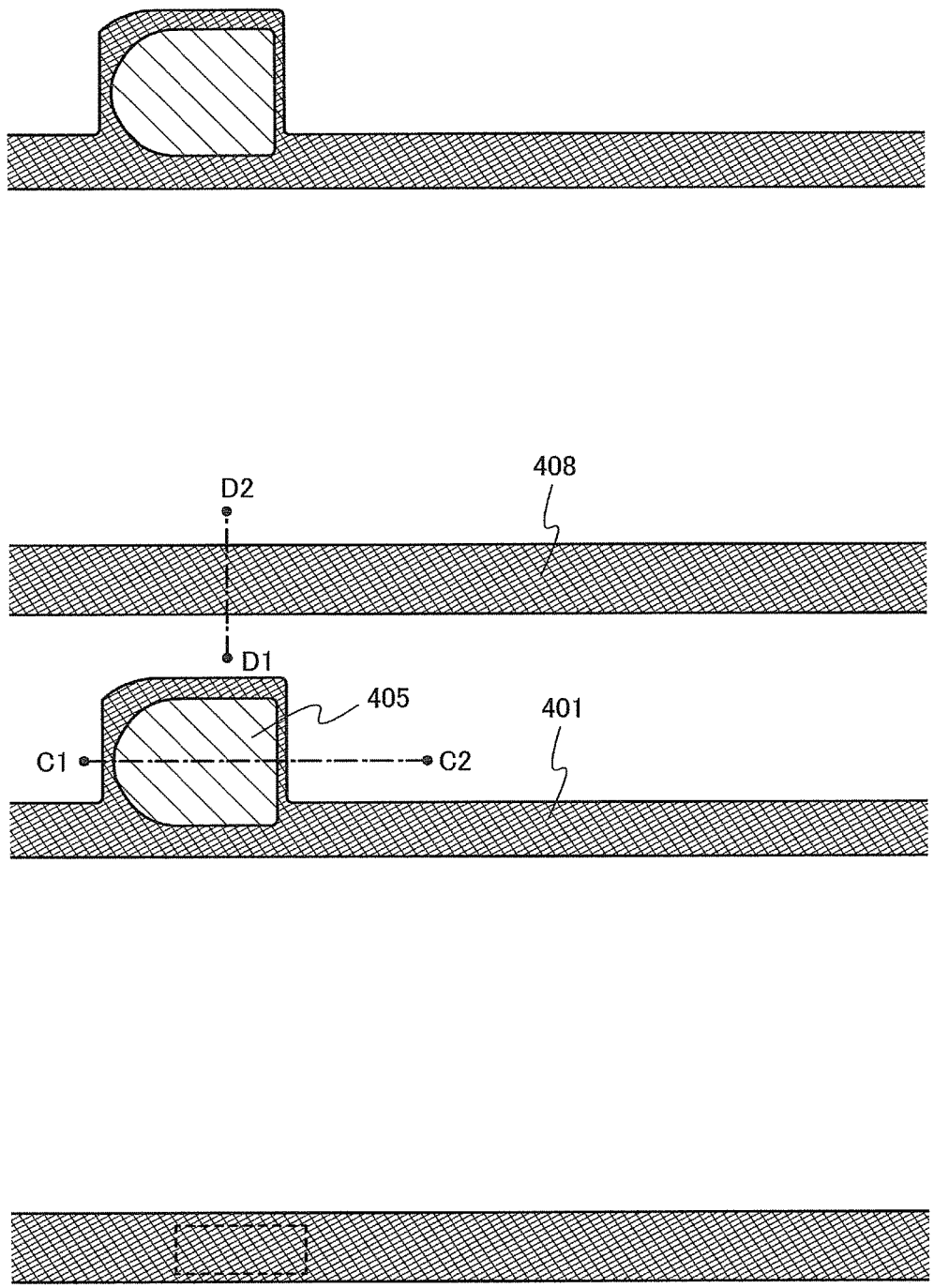
FIG. 8 is a view illustrating a method for manufacturing a semiconductor device.

Cross-sectional views taken along dashed lines C1-C2 and D1-D2 in FIG. 6A correspond to cross-sectional views taken along dashed lines C1-C2 and D1-D2 in a plan view illustrated in FIG. 8, respectively.

Next, as illustrated in FIG. 6B, a conductive film 406 is formed using a metal material over the oxide semiconductor film 405 by a sputtering method or a vacuum evaporation method. As the material of the conductive film 406, there are an element selected from aluminum, chromium, tantalum, titanium, molybdenum, and tungsten, an alloy including any of these elements as a component, an alloy film including a combination of any of these elements, and the like.

In the case where heat treatment is performed after the formation of the conductive film 406, it is preferable that the conductive film have heat resistance enough to withstand the heat treatment.

Next, as illustrated in FIG. 6C, a third photolithography step is performed in such a manner that a resist mask is formed and unnecessary portions are removed by etching, so that a source electrode 407a, a drain electrode 407b, and a second terminal 420 are formed. Wet etching or dry etching is used as an etching method at this time. For example, when an aluminum film or an aluminum-alloy film is used as the conductive film 406, wet etching using a mixed solution of phosphoric acid, acetic acid, and nitric acid can be performed. Alternatively, by wet etching using an ammonia peroxide mixture (hydrogen peroxide:ammonia:water=5:2:2), the conductive film 406 may be etched to form the source electrode 407a and the drain electrode 407b.

In the etching step, part of the oxide semiconductor film 405, which is an exposed region, is etched, whereby an island-shaped oxide semiconductor film 409 is formed. Accordingly, the oxide semiconductor film 409 has a region whose thickness is small between the source electrode 407a and the drain electrode 407b.

In the third photolithography step, the second terminal 420 which is formed using the same material as the source electrode 407a and the drain electrode 407b is left in the terminal portion. Note that the second terminal 420 is electrically connected to a source wiring (a source wiring including the source electrode 407a).

Further, by using a resist mask which is formed using a multi-tone mask and has regions with plural thicknesses (for example, two different thicknesses), the number of resist masks can be reduced, resulting in simplified process and lower costs.

Next, the resist mask is removed, and the oxide semiconductor film 409 is irradiated with an electromagnetic wave under an inert gas (for example, nitrogen, helium, neon, or argon) atmosphere, an oxygen atmosphere, an ultra-dry air atmosphere, or reduced pressure as illustrated in FIG. 7A. It is desirable that the content of water in the gas be 20 ppm or less, preferably 1 ppm or less, and more preferably 10 ppb or less. Impurities such as moisture, hydrogen, or OH are desorbed by the irradiation with an electromagnetic wave, so that a highly purified oxide semiconductor film 410 is formed. Heat treatment may be performed at the same time as the irradiation with an electromagnetic wave. Note that the description of the irradiation of the island-shaped oxide semiconductor film 404 with an electromagnetic wave can be referred to for implementation of the irradiation of the oxide semiconductor film 409 with an electromagnetic wave and heat treatment for implementation.

According to an embodiment of the present invention, even when high-temperature heat treatment using irradiation with an electromagnetic wave is not performed, desorption of impurities such as water, hydrogen, or OH in the oxide semiconductor can be performed at a lower temperature in a shorter time. Therefore, a metal included in the source electrode 407a and the drain electrode 407b can be prevented from entering the island-shaped oxide semiconductor film 410 through heat treatment for desorption of impurities such as water, hydrogen, or OH, and deterioration in characteristics of the transistor, for example, off-state current can be prevented.

Moreover, in this embodiment, the island-shaped oxide semiconductor film 404 formed by patterning is irradiated with an electromagnetic wave. In addition, the island-shaped oxide semiconductor film 409 formed at the same time as the source electrode 407a and the drain electrode 407b are irradiated with an electromagnetic wave again. However, irradiation with an electromagnetic wave does not always need to be performed twice. Irradiation with an electromagnetic wave may be performed on either one of the island-shaped oxide semiconductor film 404 formed by patterning or the island-shaped oxide semiconductor film 409 formed at the same time as the source electrode 407a and the drain electrode 407b. Alternatively, instead of the irradiation with an electromagnetic wave performed on the island-shaped oxide semiconductor film 404 formed by patterning, which is one of the two irradiation treatments with an electromagnetic wave, irradiation with an electromagnetic wave may be performed on the oxide semiconductor film 403 before the formation of the island-shaped oxide semiconductor film 404 by patterning. Still alternatively, in addition to the two irradiation treatments with an electromagnetic wave, irradiation with an electromagnetic wave may be performed on the oxide semiconductor film 403. Further still alternatively, irradiation with an electromagnetic wave may be performed only on the oxide semiconductor film 403.

Figure 9:
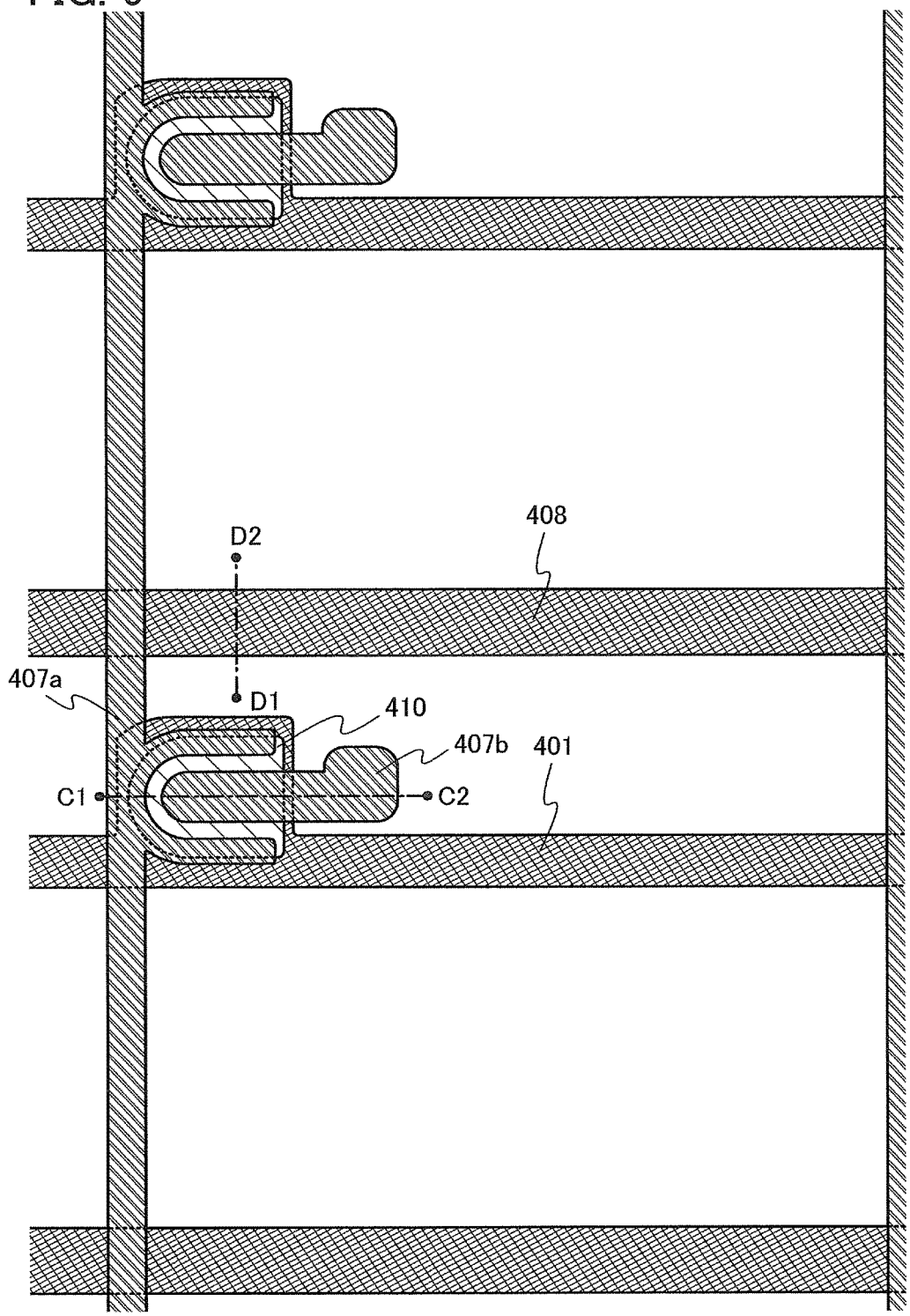
FIG. 9 is a view illustrating a method for manufacturing a semiconductor device.
Figure 10:
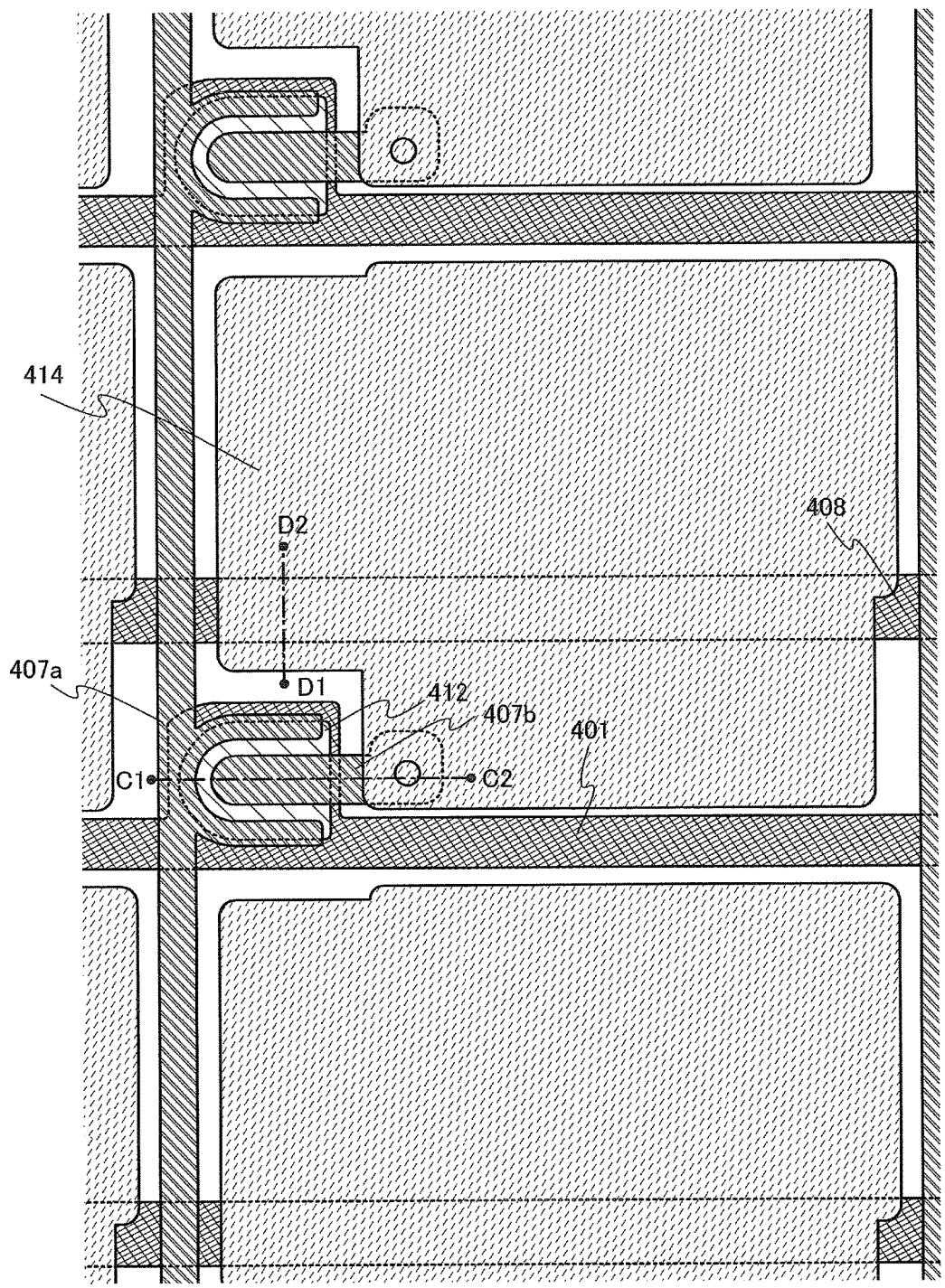
FIG. 10 is a view illustrating a method for manufacturing a semiconductor device.

Cross-sectional views taken along dashed lines C1-C2 and D1-D2 in FIG. 7A correspond to cross-sectional views taken along dashed lines C1-C2 and D1-D2 in a plan view illustrated in FIG. 9, respectively.

Next, as illustrated in FIG. 7B, an oxide insulating film 411 which covers the gate insulating film 402, the oxide semiconductor film 410, the source electrode 407a, and the drain electrode 407b is formed. The oxide insulating film 411 is formed using a silicon oxynitride film by a PCVD method. When the silicon oxynitride film serving as the oxide insulating film 411 is formed in contact with an exposed region of the oxide semiconductor film 410 provided between the source electrode 407a and the drain electrode 407b, oxygen is supplied to the oxide semiconductor film 410 even if oxygen vacancy occurs in the oxide semiconductor film 410 due to irradiation with an electromagnetic wave or heat treatment performed at the same time as the irradiation with an electromagnetic wave. Therefore, a vacancy of oxygen serving as a donor can be reduced in part of the oxide semiconductor film 410, which is in contact with the oxide insulating film 411, and thus the stoichiometric proportion can be satisfied. As a result, the oxide semiconductor film 410 can be made to be an intrinsic semiconductor film or a substantially intrinsic semiconductor film, so that an oxide semiconductor film 412 can be formed. Accordingly, electric characteristics of the transistor can be improved and variation in the electric characteristics thereof can be suppressed.

Next, after the oxide insulating film 411 is formed, heat treatment may be performed. The heat treatment may be performed at higher than or equal to 150° C. and lower than 350° C. under an air atmosphere or a nitrogen atmosphere. By the heat treatment, the oxide semiconductor film 412 is heated while being in contact with the oxide insulating film 411. In addition, the resistance of the oxide semiconductor film 412 is increased. Accordingly, electric characteristics of the transistor can be improved and variation in the electric characteristics thereof can be reduced. There is no particular limitation on when to perform this heat treatment (preferably at higher than or equal to 150° C. and lower than 350° C.) as long as it is performed after the formation of the oxide insulating film 411. When this heat treatment also serves as heat treatment in another step, for example, heat treatment in a formation of a resin film or heat treatment for reducing resistance of a transparent conductive film, the number of steps can be prevented from increasing.

Through the above steps, a transistor 413 can be manufactured.

Next, a fourth photolithography step is performed in such a manner that a resist mask is formed and the oxide insulating film 411 and the gate insulating film 402 are etched, so that a contact hole is formed to expose parts of the drain electrode 407b, the first terminal 421, and the second terminal 420. Next, the resist mask is removed, and then a transparent conductive film is formed. The transparent conductive film is formed using indium oxide ($In_2O_3$), indium oxide-tin oxide alloy ($In_2O_3$—$SnO_2$, abbreviated as ITO), or the like by a sputtering method, a vacuum evaporation method, or the like. Such a material is etched with a hydrochloric acid-based solution. However, since a residue is easily generated particularly in etching ITO, indium oxide-zinc oxide alloy ($In_2O_3$—ZnO) may be used to improve etching processability. Moreover, in the case where heat treatment for reducing resistance of the transparent conductive film, the heat treatment can serve as heat treatment for increasing resistance of the oxide semiconductor film 412, which results in improvement of electric characteristics of the transistor and reduction in variation in the electric characteristics thereof.

Next, a fifth photolithography step is performed in such a manner that a resist mask is formed and unnecessary portions are removed by etching, so that a pixel electrode 414 which is connected to the drain electrode 407b, a transparent conductive film 415 which is connected to the first terminal 421, and a transparent conductive film 416 which is connected to the second terminal 420 are formed.

The transparent conductive films 415 and 416 serve as electrodes or wirings connected to an FPC. The transparent conductive film 415 formed over the first terminal 421 is a connection terminal electrode which functions as an input terminal of the gate wiring. The transparent conductive film 416 formed over the second terminal 420 is a connection terminal electrode which functions as an input terminal of the source wiring.

In the fifth photolithography step, a storage capacitor is formed with the capacitor wiring 408 and the pixel electrode 414, in which the gate insulating film 402 and the oxide insulating film 411 are used as dielectrics.

A cross-sectional view after the resist mask is removed is illustrated in FIG. 7C. Cross-sectional views taken along dashed lines C1-C2 and D1-D2 in FIG. 7C correspond to cross-sectional views taken along dashed lines C1-C2 and D1-D2 in a plan view illustrated in FIG. 10, respectively.

Through these five photolithography steps, the storage capacitor and a pixel transistor portion including the transistor 413 which is a bottom-gate transistor having a staggered structure can be completed using the five photomasks. By disposing the transistor and the storage capacitor in each pixel of a pixel portion in which pixels are arranged in matrix, one of substrates for manufacturing an active matrix display device can be obtained. In this specification, such a substrate is referred to as an active matrix substrate for convenience.

In the case of manufacturing an active matrix liquid crystal display device, an active matrix substrate and a counter substrate provided with a counter electrode are fixed to each other with a liquid crystal layer interposed therebetween.

Alternatively, a storage capacitor may be formed with a pixel electrode which overlaps with a gate wiring of an adjacent pixel, with an oxide insulating film and a gate insulating film interposed therebetween, without provision of the capacitor wiring.

In an active matrix liquid crystal display device, pixel electrodes arranged in matrix are driven so that a display pattern is formed on a screen. Specifically, voltage is applied between a selected pixel electrode and a counter electrode corresponding to the pixel electrode, so that a liquid crystal layer is optically modulated due to electric field generated between the pixel electrode and the counter electrode, and this optical modulation is recognized as a display pattern by an observer.

In displaying moving images, a liquid crystal display device has a problem in that a long response time of liquid crystal molecules themselves causes afterimages or blurring of moving images. In order to improve moving image characteristics of a liquid crystal display device, there is a driving technique called black insertion by which a black image is displayed on the whole screen every other frame period.

Alternatively, a driving technique called double-frame rate driving may be employed in which a frame frequency is 1.5 times or more, preferably, two times or more as high as a usual frame frequency (60 Hz), whereby the moving image characteristics is improved.

Further, in order to improve moving image characteristics of a liquid crystal display device, there is another driving technique in which a surface light source including a plurality of light-emitting diode (LED) light sources or a plurality of EL light sources is used as a backlight, and each light source included in the surface light source is independently driven in a pulsed manner in one frame period. As the surface light source, three or more kinds of LEDs may be used and an LED emitting white light may be used. Since a plurality of LEDs can be controlled independently, the light emission timing of LEDs can be synchronized with the timing at which a liquid crystal layer is optically modulated. According to this driving technique, LEDs can be partly turned off; therefore, an effect of reducing power consumption can be obtained particularly in the case of displaying an image having a large part on which black is displayed.

By combining these driving techniques, the display characteristics of a liquid crystal display device, such as moving-image characteristics, can be improved as compared to those of conventional liquid crystal display devices.

The n-channel transistor disclosed in this specification includes an oxide semiconductor film used for a channel formation region and has favorable dynamic characteristics; thus, it can be combined with these driving techniques.

In manufacturing a light-emitting display device, a partition wall including an organic resin film is provided between organic light-emitting elements in some cases. In that case, heat treatment performed on the organic resin layer can also serve as the heat treatment for improvement of electric characteristics of the transistor and reduction in variation in the electric characteristics thereof.

The use of an oxide semiconductor for a transistor leads to reduction in manufacturing cost. In particular, by the irradiation with an electromagnetic wave, impurities such as moisture, hydrogen, or OH are reduced and the purity of the oxide semiconductor film is increased. Therefore, a semiconductor device including a highly reliable transistor having favorable electric characteristics can be manufactured without using an ultrapure oxide semiconductor target or a special sputtering apparatus in which dew point in a film-formation chamber is reduced.

Since the semiconductor film in the channel formation region is a region whose resistance is increased, electric characteristics of the transistor are stabilized, and increase in off current or the like can be prevented. Accordingly, a semiconductor device including the highly reliable transistor having favorable electric characteristics can be provided.

This embodiment can be implemented in appropriate combination with any of the structures described in the other embodiments.

EMBODIMENT 4

In this embodiment, a method for manufacturing a semiconductor device including a transistor whose structure is different from those of the transistor 112 described in Embodiment 1 and the transistor 212 described in Embodiment 2 is described. Note that the same portions as Embodiment 1 or portions having functions similar to those of Embodiment 1 can be formed in a manner similar to that of Embodiment 1, and repetitive description thereof is omitted.

A method for manufacturing a semiconductor device is described with reference to FIGS. 11A to 11D and FIG. 12.

Figure 11A:
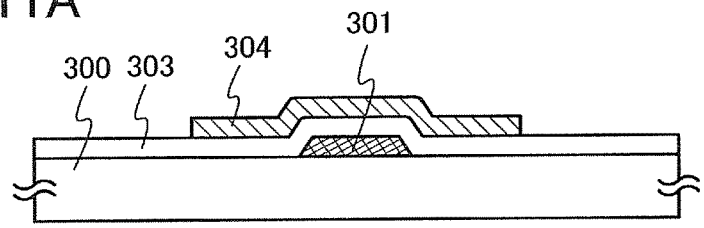
FIGS. 11A to 11D are views illustrating a method for manufacturing a semiconductor device.

As illustrated in FIG. 11A, a gate electrode 301 is provided over a substrate 300 having an insulating surface. An insulating film serving as a base film may be provided between the substrate 300 and the gate electrode 301. The descriptions of the material and the structure of the gate electrode 101 in Embodiment 1 may be referred to for details of the material and the structure of the gate electrode 301. The insulating film can be formed to have a single layer or a stacked layer using one or more of insulating films which prevent diffusion of impurity elements from the substrate 300, specifically, a silicon nitride film, a silicon oxide film, a silicon nitride oxide film, and a silicon oxynitride film.

Next, a gate insulating film 303 is formed over the gate electrode 301. The gate insulating film 303 can be formed using a single layer or a stacked layer selected from a silicon oxide film, a silicon nitride film, a silicon oxynitride film, and a silicon nitride oxide film by a plasma CVD method, a sputtering method, or the like. For example, a silicon oxynitride film may be formed using a deposition gas including silane (for example, monosilane), oxygen, and nitrogen by a plasma CVD method.

Next, an oxide semiconductor film is formed over the gate insulating film 303. Then, the oxide semiconductor film is processed (patterned) into a desired shape by etching or the like, so that an island-shaped oxide semiconductor film 304 (a first oxide semiconductor film) are formed.

An oxide semiconductor film for forming a channel formation region may be formed using an oxide material having semiconductor characteristics described in Embodiment 1. The oxide semiconductor film can be formed by a sputtering method under a rare gas (for example, argon) atmosphere, an oxygen atmosphere, or an atmosphere including a rare gas (for example, argon) and oxygen. Note that before the oxide semiconductor film is formed by a sputtering method, dust attached to a surface of the gate insulating film 303 is preferably removed by reverse sputtering in which an argon gas is introduced and plasma is generated.

Figure 11B:
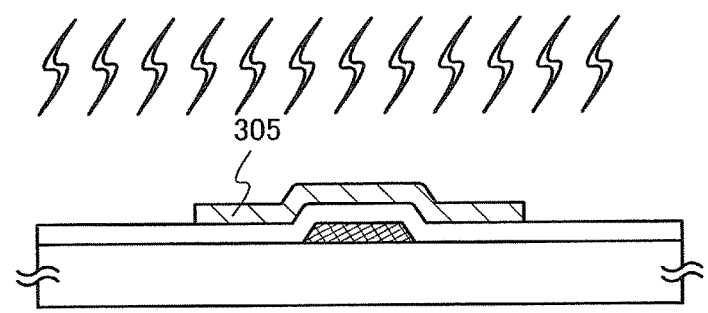

Next, as illustrated in FIG. 11B, the island-shaped oxide semiconductor film 304 is irradiated with an electromagnetic wave such as a microwave or a high frequency under an inert gas (for example, nitrogen, helium, neon, or argon) atmosphere, an oxygen atmosphere, an ultra-dry air atmosphere, or reduced pressure, so that moisture, hydrogen, OH, or the like is desorbed, whereby a highly purified island-shaped oxide semiconductor film 305 (a second oxide semiconductor film) is formed. It is desirable that the content of water in the gas be 20 ppm or less, preferably 1 ppm or less, and more preferably 10 ppb or less. Heat treatment may be performed on the island-shaped oxide semiconductor film 304 at the same time as the irradiation with an electromagnetic wave.

The descriptions of the irradiation with an electromagnetic wave and heat treatment performed on the oxide semiconductor film 104 in Embodiment 1 may be referred to for details of the irradiation with an electromagnetic wave and heat treatment performed on the oxide semiconductor film 304.

In a transistor including the oxide semiconductor highly purified by desorption of moisture, hydrogen, OH, or the like as a channel formation region, deterioration in characteristics of the transistor due to impurities, for example, variation in the threshold voltage, can be suppressed, whereby high reliability can be obtained.

Note that although the irradiation with an electromagnetic wave is performed on the island-shaped oxide semiconductor film 304 formed by patterning in this embodiment, irradiation with an electromagnetic wave may be performed on the oxide semiconductor film not after patterning but before patterning. Alternatively, irradiation with an electromagnetic wave may be performed both before and after patterning.

Next, a channel protective film 313 is formed over the island-shaped oxide semiconductor film 305 so as to overlap with a portion of the island-shaped oxide semiconductor film 305, which serves as a channel formation region later. The channel protective film 313 can prevent the portion of the island-shaped oxide semiconductor film 305, which serves as a channel formation region later, from being damaged in a later step (for example, reduction in thickness due to plasma or an etchant in etching). Therefore, reliability of the transistor can be improved.

The channel protective film 313 can be formed using an inorganic material including oxygen (such as silicon oxide, silicon oxynitride, or silicon nitride oxide). The channel protective film 313 can be formed by a vapor deposition method such as a plasma CVD method or a thermal CVD method, or a sputtering method. After the formation of the channel protective film 313, the shape thereof is processed by etching. Here, the channel protective film 313 is formed in such a manner that a silicon oxide film is formed by a sputtering method and processed by etching using a mask formed by photolithography.

Moreover, after the irradiation with an electromagnetic wave, an oxide insulating film serving as the channel protective film 313 can also be formed successively without exposure to air. Successive film formation without exposure to air makes it possible to obtain each interface between stacked layers, which is not contaminated by atmospheric components or impurity elements floating in air, such as water, hydrocarbon, or the like. Therefore, variation in characteristics of the transistor can be reduced.

When the channel protective film 313 which is an oxide insulating film is formed in contact with the highly purified oxide semiconductor film 305 by a sputtering method, a PCVD method, or the like, oxygen is supplied to the oxide semiconductor film 305 even if oxygen vacancy occurs in the oxide semiconductor film 305 due to irradiation with an electromagnetic wave or heat treatment performed at the same time as the irradiation with an electromagnetic wave. Therefore, a vacancy of oxygen serving as a donor can be reduced in part of the oxide semiconductor film 305, which is in contact with the channel protective film 313, and thus the stoichiometric proportion can be satisfied. As a result, the oxide semiconductor film 305 can be made to be an intrinsic semiconductor film or a substantially intrinsic semiconductor film, so that an oxide semiconductor film 311 (a third oxide semiconductor film) can be formed. Accordingly, electric characteristics of the transistor can be improved and variation in the electric characteristics thereof can be reduced.

Figure 11C:
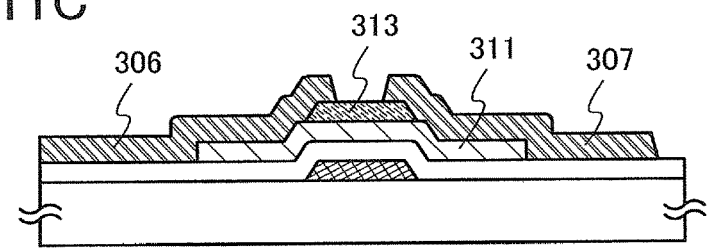

Next, a conductive film is formed over the island-shaped oxide semiconductor film 311 and the channel protective film 313. Then, the conductive film is processed (patterned) into a desired shape by etching or the like, so that a source electrode 306 and a drain electrode 307 are formed as illustrated in FIG. 11C. The description of the material of the conductive film patterned in the formation of the source electrode 106 and the drain electrode 107 in Embodiment 1 may be referred to for details of the material of the conductive film.

Figure 11D:
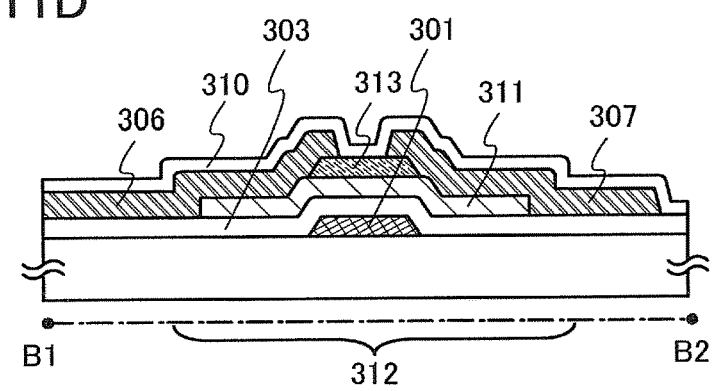

Next, as illustrated in FIG. 11D, an insulating film 310 is formed in contact with the island-shaped oxide semiconductor film 311 by a sputtering method. The insulating film 310 is formed in contact with the highly purified island-shaped oxide semiconductor film 305 and formed using an inorganic insulating film which includes impurities such as moisture, hydrogen, and OH as little as possible and blocks entry of these impurities from the outside, specifically, a silicon oxide film, a silicon nitride oxide film, or the like.

In this embodiment, a 300-nm-thick silicon oxide film is formed as the insulating film 310. The substrate temperature in the film formation may be higher than or equal to room temperature and lower than or equal to 300° C., and is set at 100° C. in this embodiment.

Figure 12:
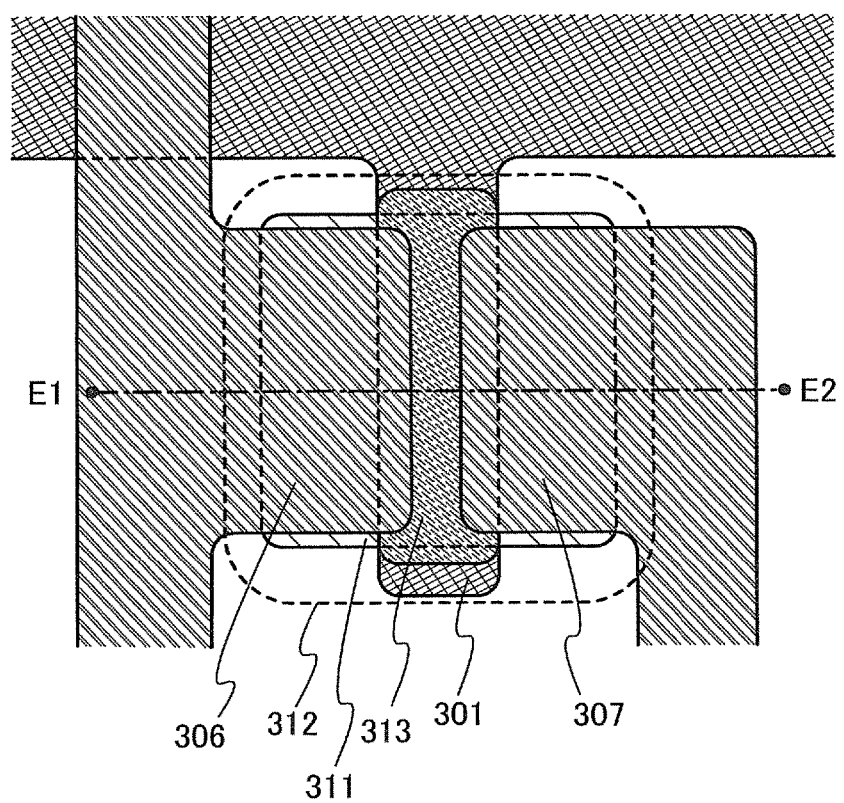
FIG. 12 is a top view of a manufactured transistor.

FIG. 12 is a top view of a transistor 312 manufactured in this embodiment. FIG. 11E is a cross-sectional view taken along dashed line B1-B2 in FIG. 12. The transistor 312 includes the gate electrode 301, the gate insulating film 303 over the gate electrode 301, the oxide semiconductor film 311 over the gate insulating film 303, the channel protective film 313 over the oxide semiconductor film 311, and the source electrode 306 and the drain electrode 307 over the oxide semiconductor film 311 and the channel protective film 313.

Further, after the insulating film 310 is formed, the transistor 312 may be subjected to heat treatment (preferably at higher than or equal to 150° C. and lower than 350° C.) under a nitrogen atmosphere or an air atmosphere (in air). For example, heat treatment is performed at 250° C. for one hour under a nitrogen atmosphere. By the heat treatment, the oxide semiconductor film 311 is heated while being in contact with the channel protective film 313. Accordingly, variation in electric characteristics of the transistor 312 can be reduced. There is no particular limitation on when to perform this heat treatment (preferably at higher than or equal to 150° C. and lower than 350° C.) as long as it is performed after the formation of the channel protective film 313. When this heat treatment also serves as heat treatment in another step, for example, heat treatment in formation of a resin film or heat treatment for reducing resistance of a transparent conductive film, the number of steps can be prevented from increasing.

Note that a step of forming the island-shaped oxide semiconductor film 304, a step of forming the island-shaped oxide semiconductor film 305 by irradiating the island-shaped oxide semiconductor film 304 with an electromagnetic wave, and a step of forming the channel protective film 313 in contact with the oxide semiconductor film 311 are successively performed (also referred to as successive treatment or an insitu process) without exposure to air, whereby impurities such as moisture, hydrogen, or OH included in the oxide semiconductor film 311 which is finally formed can be further reduced. As a result, reliability of the transistor 312 can be more improved.

This embodiment can be freely combined with any of the other embodiments.

EMBODIMENT 5

In this embodiment, a structure of a transistor which can be formed in accordance with the method for manufacturing a semiconductor device which is the present invention and whose structure is partly different from those in Embodiments 1 to 4 is described.

Figure 13A:
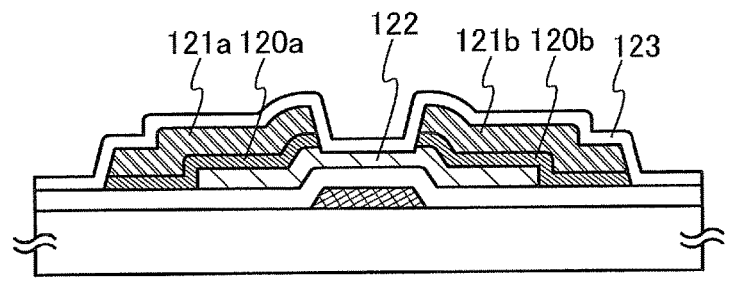
FIGS. 13A to 13C are cross-sectional views of manufactured transistors.

First, a structure of the transistor illustrated in FIG. 13A and a manufacturing method thereof are described.

In Embodiment 1, after the island-shaped oxide semiconductor film 105 is formed, a second oxide semiconductor film used as a source region and a drain region (also referred to as an $n^+$ layer or a buffer layer) of a transistor is formed over the oxide semiconductor film 105 and then a conductive film is formed over the second oxide semiconductor film.

Then, the second oxide semiconductor film and the conductive film are selectively etched through an etching step to form a source region 120a and a drain region 120b (also referred to as an $n^+$ layer or a buffer layer) using the second oxide semiconductor film and to form a source electrode 121a and a drain electrode 121b using the conductive film. An In—Ga—Zn—O-based non-single-crystal film is used as the source region 120a and the drain region 120b. Note that through the etching step, part of the island-shaped oxide semiconductor film 105, which is an exposed region not overlapping with the source region 120a and the drain region 120b, is etched, whereby an oxide semiconductor film having a groove (a recessed portion) is formed.

Next, a silicon oxide film as an oxide insulating film 123 is formed in contact with the oxide semiconductor film having a groove by a sputtering method or a PCVD method. The oxide insulating film 123 is formed in contact with the oxide semiconductor film having a groove and formed using an inorganic insulating film which includes impurities such as moisture, a hydrogen ion, and $OH^-$ as little as possible and blocks entry of these impurities from the outside, specifically, a silicon oxide film or a silicon nitride oxide film.

When the oxide insulating film 123 is formed in contact with the oxide semiconductor film having a groove by a sputtering method, a PCVD method, or the like, oxygen is supplied to the oxide semiconductor film having a groove even when an oxygen vacancy occurs in the oxide semiconductor film having a groove due to irradiation with an electromagnetic wave or heat treatment performed at the same time as the irradiation with an electromagnetic wave. Therefore, a vacancy of oxygen serving as a donor can be reduced in part of the oxide semiconductor film, which is in contact with the oxide insulating film 123, and thus the stoichiometric proportion can be satisfied. As a result, the oxide semiconductor film having a groove can be made to be an intrinsic semiconductor film or a substantially intrinsic semiconductor film, so that an oxide semiconductor film 122 can be formed. Accordingly, a transistor, which is illustrated in FIG. 13A, whose electric characteristics can be improved and variation in electric characteristics can be reduced can be obtained.

Further, the source region 120*a* is provided between the oxide semiconductor film 122 and the source electrode 121*a*, and the drain region 120*b* is provided between the oxide semiconductor film 122 and the drain electrode 121*b*. As the source region 120*a* and the drain region 120*b*, an oxide semiconductor film having an n-type conductivity is used.

In addition, it is preferable that the second oxide semiconductor film used as the source region 120*a* and the drain region 120*b* of the transistor be thinner and have higher conductivity (electrical conductivity) than the first oxide semiconductor film used as a channel formation region.

Further, the first oxide semiconductor film used as the channel formation region has an amorphous structure, and the second oxide semiconductor film used as the source region 120*a* and the drain region 120*b* includes a crystal grain (nanocrystal) in an amorphous structure in some cases. The crystal grain (nanocrystal) in the second oxide semiconductor film used as the source region 120*a* and the drain region 120*b* has a diameter of 1 nm to 10 nm, typically about 2 nm to 4 nm.

Further, after the oxide insulating film 123 is formed, the transistor may be subjected to heat treatment (preferably at higher than or equal to 150° C. and lower than 350° C.) under a nitrogen atmosphere or an air atmosphere (in air). For example, heat treatment is performed at 250° C. for one hour under a nitrogen atmosphere. By the heat treatment, the oxide semiconductor film 122 is heated while being in contact with the oxide insulating film 123. Accordingly, variation in electric characteristics of the transistor can be reduced.

Figure 13B:
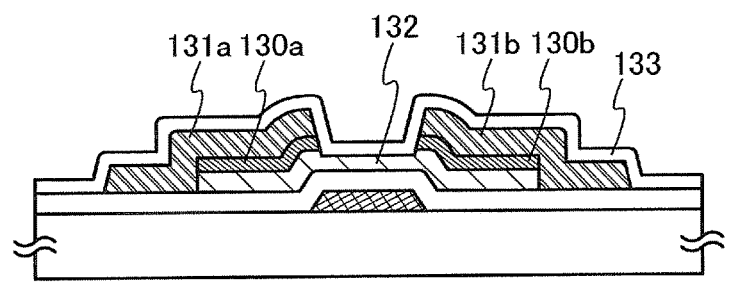

Next, a structure of the transistor illustrated in FIG. 13B and a manufacturing method thereof are described.

After the oxide semiconductor film before being patterned is formed in Embodiment 1, a second oxide semiconductor film used as a source region and a drain region (also referred to as an n⁺ layer or a buffer layer) of a transistor is formed over the oxide semiconductor film. An In—Ga—Zn—O-based non-single-crystal film is used as the second oxide semiconductor film.

Next, the oxide semiconductor film before being patterned and the second oxide semiconductor film are etched, and a first island-shaped oxide semiconductor film serving as a channel formation region and a second island-shaped oxide semiconductor film are formed using the oxide semiconductor film before being patterned and the second oxide semiconductor film, respectively.

Then, the first island-shaped oxide semiconductor film and the second island-shaped oxide semiconductor film are irradiated with an electromagnetic wave or subjected to heat treatment in combination with the irradiation with an electromagnetic wave, so that impurities such as moisture, hydrogen, or OH can be desorbed from the first island-shaped oxide semiconductor film and the second island-shaped oxide semiconductor film.

Then, a conductive film is formed over the first island-shaped oxide semiconductor film and the second island-shaped oxide semiconductor film and selectively etched to form a source region 130*a* and a drain region 130*b* (also referred to as an n⁺ layer or a buffer layer) using the second island-shaped oxide semiconductor film and to form a source electrode 131*a* and a drain electrode 131*b* using the conductive film. Note that through the etching step, part of the first island-shaped oxide semiconductor film, which is an exposed region not overlapping with the source region 130*a* and the drain region 130*b*, is etched, whereby an oxide semiconductor film having a groove (a recessed portion) is formed.

Next, a silicon oxide film as the oxide insulating film 133 is formed in contact with the oxide semiconductor film having a groove by a sputtering method or a PCVD method. The oxide insulating film 133 is formed in contact with the oxide semiconductor film having a groove and formed using an inorganic insulating film which includes impurities such as moisture, hydrogen, and OH as little as possible and blocks entry of these impurities from the outside, specifically, a silicon oxide film or a silicon nitride oxide film.

When the oxide insulating film 133 is formed in contact with the oxide semiconductor film having a groove by a sputtering method, a PCVD method, or the like, oxygen is supplied to the oxide semiconductor film having a groove even if oxygen vacancy occurs in the oxide semiconductor film having a groove due to irradiation with an electromagnetic wave or heat treatment performed at the same time as the irradiation with an electromagnetic wave. Therefore, a vacancy of oxygen serving as a donor can be reduced in part of the oxide semiconductor film, which is in contact with the oxide insulating film 133, and thus the stoichiometric proportion can be satisfied. As a result, the oxide semiconductor film having a groove can be made to be an intrinsic semiconductor film or a substantially intrinsic semiconductor film, so that an oxide semiconductor film 132 can be formed. Accordingly, a transistor, which is illustrated in FIG. 13B, whose electric characteristics can be improved and variation in the electric characteristics can be reduced can be obtained.

Moreover, the source region 130*a* is provided between the oxide semiconductor film 132 and the source electrode 131*a*, and the drain region 130*b* is provided between the oxide semiconductor film 132 and the drain electrode 131*b*. As the source region 130*a* and the drain region 130*b*, an oxide semiconductor film having an n-type conductivity is used.

In addition, it is preferable that the second oxide semiconductor film used as the source region 130*a* and the drain region 130*b* of the transistor be thinner and have higher conductivity (electrical conductivity) than the first oxide semiconductor film used as a channel formation region.

Further, the first oxide semiconductor film used as the channel formation region has an amorphous structure, and the second oxide semiconductor film used as the source region 130*a* and the drain region 130*b* includes a crystal grain (nanocrystal) in an amorphous structure in some cases. The crystal grain (nanocrystal) in the second oxide semiconductor film used as the source region 130*a* and the drain region 130*b* has a diameter of 1 nm to 10 nm, typically about 2 nm to 4 nm.

Further, after the oxide insulating film 133 is formed, the transistor may be subjected to heat treatment (preferably at higher than or equal to 150° C. and lower than 350° C.) under a nitrogen atmosphere or an air atmosphere (in air). For example, heat treatment is performed at 250° C. for one hour under a nitrogen atmosphere. By the heat treatment, the oxide semiconductor film 132 is heated while being in contact with the oxide insulating film 133. Accordingly, variation in electric characteristics of the transistor can be reduced.

Figure 13C:
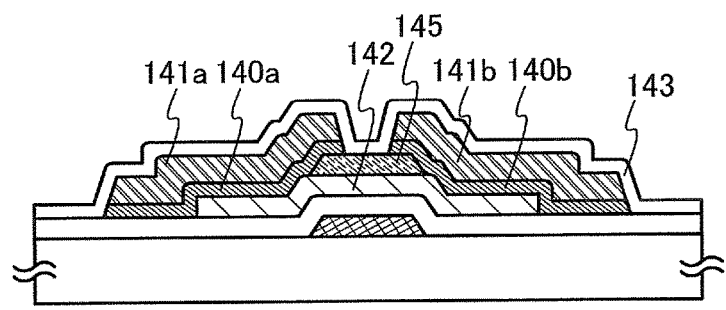

A structure of the transistor illustrated in FIG. 13C and a manufacturing method thereof are described.

After the island-shaped oxide semiconductor film 105 is formed in Embodiment 1, a channel protective film 145 is formed over part of the island-shaped oxide semiconductor film 105, which overlaps with a portion serving as a channel formation region later. The channel protective film 145 can be formed using an inorganic material including oxygen (such as silicon oxide, silicon oxynitride, or silicon nitride oxide). When the channel protective film 145 which is an oxide insulating film is formed in contact with the highly purified oxide semiconductor film 105 by a sputtering method, a PCVD method, or the like, oxygen is supplied to the oxide semiconductor film 105 even if oxygen vacancy occurs in the oxide semiconductor film 105 due to irradiation with an electromagnetic wave or heat treatment performed at the same time as the irradiation with an electromagnetic wave. Therefore, a vacancy of oxygen serving as a donor can be reduced in part of the oxide semiconductor film 105, which is in contact with the channel protective film 145, and thus the stoichiometric proportion can be satisfied. As a result, the oxide semiconductor film 105 can be made to be an intrinsic semiconductor film or a substantially intrinsic semiconductor film, so that an oxide semiconductor film 142 can be formed. Accordingly, electric characteristics of the transistor can be improved and variation in the electric characteristics thereof can be reduced.

Next, a second oxide semiconductor film used as a source region and a drain region (also referred to as an n$^+$ layer or a buffer layer) of a transistor is formed over the oxide semiconductor film 142 and then a conductive film is formed over the second oxide semiconductor film.

Then, the second oxide semiconductor film and the conductive film are selectively etched through an etching step to form a source region 140a and a drain region 140b (also referred to as an n$^+$ layer or a buffer layer) using the second oxide semiconductor film and to form a source electrode 141a and a drain electrode 141b using the conductive film. An In—Ga—Zn—O-based non-single-crystal film is used as the source region 140a and the drain region 140b. The source region 140a, the drain region 140b, the source electrode 141a, and the drain electrode 141b are formed, whereby the transistor illustrated in FIG. 13C is completed.

Next, an insulating film 143 is formed so as to cover the source region 140a, the drain region 140b, the source electrode 141a, the drain electrode 141b, and the channel protective film 145 by a sputtering method or a PCVD method. The insulating film 143 is formed using an inorganic insulating film which includes impurities such as moisture, hydrogen, and OH as little as possible and blocks entry of these impurities from the outside, specifically, a silicon oxide film or a silicon nitride oxide film.

Further, the source region 140a is provided between the oxide semiconductor film 142 and the source electrode 141a, and the drain region 140b is provided between the oxide semiconductor film 142 and the drain electrode 141b. As the source region 140a and the drain region 140b, an oxide semiconductor film having an n-type conductivity is used.

In addition, it is preferable that the second oxide semiconductor film used as the source region 140a and the drain region 140b of the transistor be thinner and have higher conductivity (electrical conductivity) than the first oxide semiconductor film used as a channel formation region.

Further, the first oxide semiconductor film used as the channel formation region has an amorphous structure, and the second oxide semiconductor film used as the source region 140a and the drain region 140b includes a crystal grain (nanocrystal) in an amorphous structure in some cases. The crystal grain (nanocrystal) in the second oxide semiconductor film used as the source region 140 and the drain region 140b has a diameter of 1 nm to 10 nm, typically about 2 nm to 4 nm.

Further, after the insulating film 143 is formed, the transistor may be subjected to heat treatment (preferably at higher than or equal to 150° C. and lower than 350° C.) under a nitrogen atmosphere or an air atmosphere (in air). For example, heat treatment is performed at 250° C. for one hour under a nitrogen atmosphere. By the heat treatment, the oxide semiconductor film 142 is heated while being in contact with the channel protective film 145. Accordingly, variation in electric characteristics of the transistor can be reduced.

This embodiment can be freely combined with any of the other embodiments.

EMBODIMENT 6

In this embodiment, a structure of a liquid crystal display device including the transistor according to an embodiment of the present invention as a switching element is described.

Figure 14:
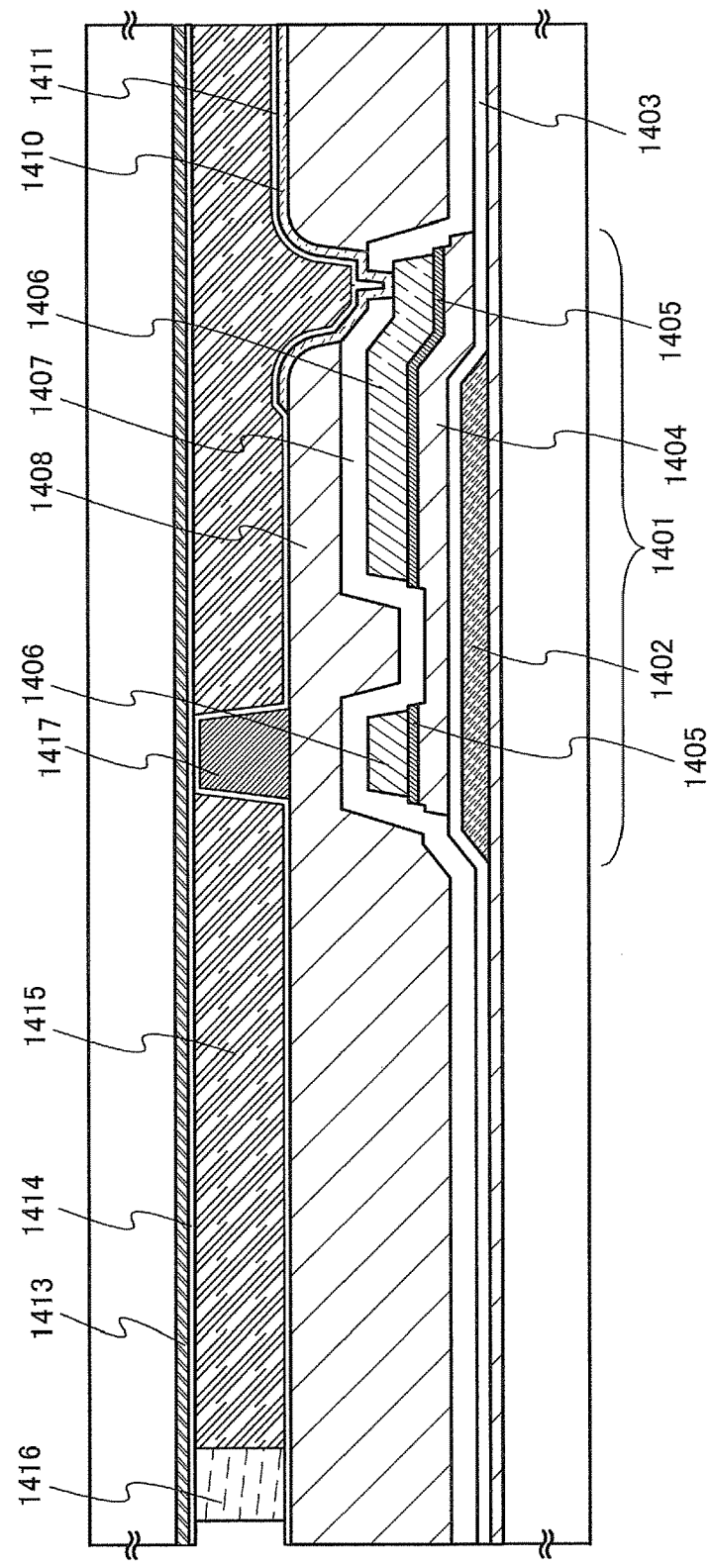
FIG. 14 is a cross-sectional view of a liquid crystal display device.

FIG. 14 illustrates a cross-sectional view of a liquid crystal display device of the present invention as an example. A transistor 1401 illustrated in FIG. 14 includes a gate electrode 1402 formed over an insulating surface, a gate insulating film 1403 formed so as to cover the gate electrode 1402, an oxide semiconductor film 1404 formed so as to overlap with the gate electrode 1402 with the gate insulating film 1403 interposed therebetween, a pair of semiconductor films 1405 functioning as a source region and a drain region, which is formed over the oxide semiconductor film 1404, a pair of conductive films 1406 functioning as a source electrode and a drain electrode, which is formed over the pair of semiconductor films 1405, and an oxide insulating film 1407. The oxide insulating film 1407 is at least in contact with the oxide semiconductor film 1404 and formed so as to cover the gate electrode 1402, the gate insulating film 1403, the oxide semiconductor film 1404, the pair of semiconductor films 1405, and the pair of conductive films 1406.

An insulating film 1408 is formed over the oxide insulating film 1407. An opening is provided in part of the oxide insulating film 1407 and the insulating film 1408, and a pixel electrode 1410 is formed so as to be in contact with one of the conductive films 1406 in the opening.

Further, a spacer 1417 for controlling a cell gap of a liquid crystal element is formed over the insulating film 1408. An insulating film is etched to have a desired shape, so that the spacer 1417 can be formed. A cell gap may also be controlled by dispersing a filler over the insulating film 1408.

Then, an alignment film 1411 is formed over the pixel electrode 1410. The alignment film 1411 can be formed by subjecting an insulating film to rubbing treatment, for example. Further, a counter electrode 1413 is provided in a position opposed to the pixel electrode 1410, and an alignment film 1414 is formed on the side of the counter electrode 1413 which is close to the pixel electrode 1410. Furthermore, a liquid crystal 1415 is provided in a region which is surrounded by a sealant 1416 between the pixel electrode 1410 and the counter electrode 1413. Note that a filler may be mixed in the sealant 1416.

The pixel electrode 1410 and the counter electrode 1413 can be formed using a transparent conductive material such as indium tin oxide (ITSO), indium tin oxide (ITO), zinc oxide (ZnO), indium zinc oxide (IZO), or gallium-doped zinc oxide (GZO), for example. Note that this embodiment describes an example of manufacturing a transmissive type liquid crystal element by using a light-transmitting conductive film for the pixel electrode 1410 and the counter electrode 1413. However, the present invention is not limited to this structure. The liquid crystal display device according to an embodiment of the present invention may be a semi-transmissive type liquid crystal display device or a reflective type liquid crystal display device.

The liquid crystal display device illustrated in FIG. 14 may be provided with a color filter, a shielding film for preventing disclination (a black matrix), or the like.

Although a liquid crystal display device of a twisted nematic (TN) mode is described in this embodiment, the transistor of the present invention can be used for other liquid crystal display devices of a vertical alignment (VA) mode, an optically compensated birefringence (OCB) mode, an in-plane-switching (IPS) mode, and the like.

In the liquid crystal display device according to an embodiment of the present invention, a highly reliable transistor with high mobility and ON current is used; therefore, the liquid crystal display device according to an embodiment of the present invention has high contrast and high visibility.

This embodiment can be freely combined with any of the other embodiments.

EMBODIMENT 7

In this embodiment, a structure of a light-emitting device including the transistor according to an embodiment of the present invention for a pixel is described. In this embodiment, a cross-sectional structure of a pixel in the case where a transistor for driving a light-emitting element is n-channel type is described with reference to FIGS. 15A to 15C. Note that FIGS. 15A to 15C illustrate the case where a first electrode is a cathode and a second electrode is an anode; however, the first electrode may be an anode and the second electrode may be a cathode.

Figure 15A:
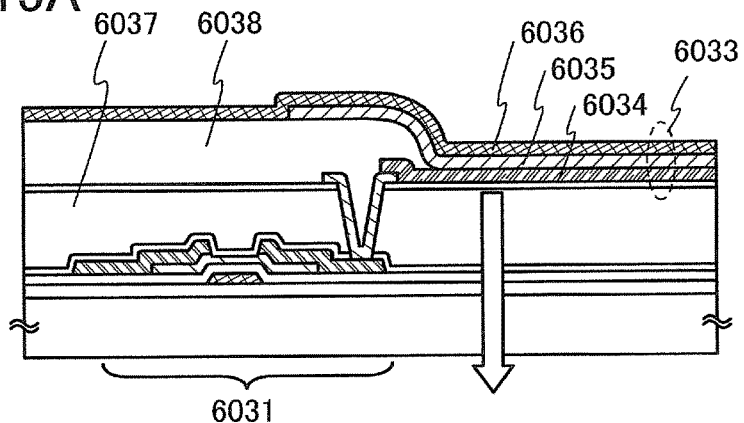
FIGS. 15A to 15C are cross-sectional views of light-emitting devices.
Figure 15B:
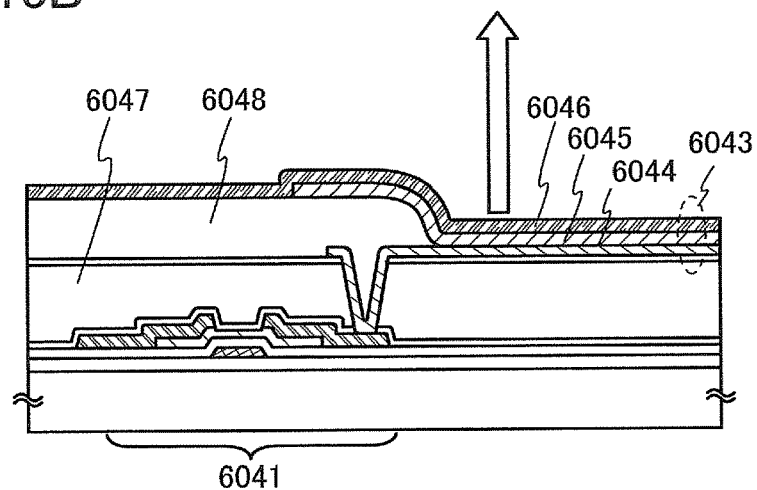
Figure 15C:
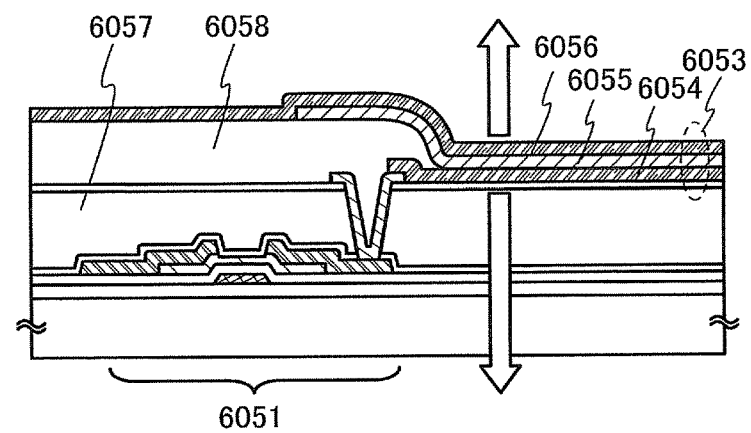

Note that FIGS. 15A to 15C each illustrate a light-emitting device in which the transistor having the structure described in Embodiment 1 is used for a pixel; however, a transistor having any of the structures described in the other Embodiments can be used for a pixel of a light-emitting device.

A cross-sectional view of a pixel in the case where a transistor 6031 is n-channel type, and light emitted from a light-emitting element 6033 is extracted from a first electrode 6034 side is illustrated in FIG. 15A. The transistor 6031 is covered with an insulating film 6037, and a partition wall 6038 having an opening is formed over the insulating film 6037. In the opening of the partition wall 6038, the first electrode 6034 is partly exposed, and the first electrode 6034, an electroluminescent layer 6035, and a second electrode 6036 are sequentially stacked in the opening.

The first electrode 6034 is formed using a material or to a thickness to transmit light, and can be formed using a material having a low work function of a metal, an alloy, an electrically conductive compound, a mixture thereof, or the like. Specifically, an alkaline metal such as Li or Cs, an alkaline earth metal such as Mg, Ca, or Sr, an alloy including such metals (for example, Mg:Ag, Al:Li, or Mg:In), a compound of such materials (for example, calcium fluoride or calcium nitride), or a rare-earth metal such as Yb or Er can be used. Further, in the case where an electron injection layer is provided, another conductive layer such as an aluminum layer may be used as well. Then, the first electrode 6034 is formed to a thickness to transmit light (preferably, approximately 5 nm to 30 nm). Further, the sheet resistance of the first electrode 6034 may be suppressed by formation of a light-transmitting conductive layer using a light-transmitting oxide conductive material so as to be in contact with and over or under the conductive layer with a thickness to transmit light. Alternatively, the first electrode 6034 may be formed using only a conductive layer of another light-transmitting oxide conductive material such as indium tin oxide (ITO), zinc oxide (ZnO), indium zinc oxide (IZO), or gallium-doped zinc oxide (GZO). Furthermore, a mixture in which zinc oxide (ZnO) is mixed at 2% to 20% in indium tin oxide including ITO and silicon oxide (hereinafter referred to as ITSO) or in indium oxide including silicon oxide may be used as well. In the case of using the light-transmitting oxide conductive material, it is preferable to provide an electron injection layer in the electroluminescent layer 6035.

The second electrode 6036 is formed using a material and to a thickness to reflect or shied light, and can be formed using a material suitable for being used as an anode. For example, a single-layer film including one or more of titanium nitride, zirconium nitride, titanium, tungsten, nickel, platinum, copper, silver, aluminum, and the like, a stacked layer of a titanium nitride film and a film including aluminum as a main component, a three-layer structure of a titanium nitride film, a film including aluminum as a main component, and a titanium nitride film, or the like can be used for the second electrode 6036.

The electroluminescent layer 6035 is formed using a single layer or a plurality of layers. In the case where the electroluminescent layer 6035 is formed using a plurality of layers, the layers can be classified into layers such as a hole injection layer, a hole transport layer, a light-emitting layer, an electron transport layer, and an electron injection layer in terms of the carrier transporting properties. In the case where the electroluminescent layer 6035 includes at least one of the hole injection layer, the hole transport layer, the electron transport layer, and the electron injection layer in addition to the light-emitting layer, the electron injection layer, the electron transport layer, the light-emitting layer, the hole transport layer, and the hole injection layer are sequentially stacked over the first electrode 6034 in this order. Note that an interface between the layers is not necessarily clear, and there might be the case where materials forming the layers are partly mixed and the interface between the layers is unclear. Each layer can be formed using an organic-based material or an inorganic-based material. As the organic-based material, any of a high molecular weight organic material, a medium molecular weight organic material, and a low molecular weight organic material can be used. Note that the medium molecular weight material corresponds to a low polymer in which the number of repetitions of a structural unit (the degree of polymerization) is approximately 2 to 20. There is no clear distinction between the hole injection layer and the hole transport layer, and the hole injection layer and the hole transport layer are the same in terms of the point that the hole transport properties (hole mobility) is particularly important characteristics for both the hole injection layer and the hole transport layer. A layer in contact with the anode is referred to as a hole injection layer and a layer in contact with the hole injection layer is referred to as a hole transport layer for convenience. The same is also true for the electron transport layer and the electron injection layer. A layer in contact with the cathode is referred to as an electron injection layer and a layer in contact with the electron injection layer is referred to as an electron transport layer. In some cases, the light-emitting layer also serves as the electron transport layer, and it is therefore referred to as a light-emitting electron transport layer, too.

In the case of the pixel illustrated in FIG. 15A, light emitted from the light-emitting element 6033 can be extracted from the first electrode 6034 side as shown by a hollow arrow.

Next, a cross-sectional view of a pixel in the case where a transistor 6041 is n-channel type, and light emitted from a light-emitting element 6043 is extracted from a second electrode 6046 side is illustrated in FIG. 15B. The transistor 6041 is covered with an insulating film 6047, and a partition wall 6048 having an opening is formed over the insulating film 6047. In the opening of the partition wall 6048, a first electrode 6044 is partly exposed, and the first electrode 6044, an electroluminescent layer 6045, and the second electrode 6046 are sequentially stacked in the opening.

The first electrode 6044 is formed using a material and to a thickness to reflect or shied light, and can be formed using a material having a low work function of a metal, an alloy, an electrically conductive compound, a mixture thereof, or the like. Specifically, an alkaline metal such as Li or Cs, an alkaline earth metal such as Mg, Ca, or Sr, an alloy including such metals (for example, Mg:Ag, Al:Li, or Mg:In), a compound of such materials (for example, calcium fluoride or calcium nitride), or a rare-earth metal such as Yb or Er can be used. Further, in the case where an electron injection layer is provided, another conductive layer such as an aluminum layer may be used as well.

The second electrode 6046 is formed using a material or to a thickness to transmit light, and can be formed using a material suitable for being used as an anode. For example, the second electrode 6046 may be formed using a light-transmitting oxide conductive material such as indium tin oxide (ITO), zinc oxide (ZnO), indium zinc oxide (IZO), or gallium-doped zinc oxide (GZO). Further, a mixture in which zinc oxide (ZnO) is mixed at 2% to 20% in indium tin oxide including ITO and silicon oxide (hereinafter referred to as ITSO) or in indium oxide including silicon oxide may be used as well for the second electrode 6046. Furthermore, a single-layer film including one or more of titanium nitride, zirconium nitride, titanium, tungsten, nickel, platinum, chromium, silver, aluminum, and the like, a stacked layer of a titanium nitride film and a film including aluminum as a main component, a three-layer structure of a titanium nitride film, a film including aluminum as a main component, and a titanium nitride film, or the like can be used for the second electrode 6046. However, in the case of using a material other than the light-transmitting oxide conductive material, the second electrode 6046 is formed to a thickness to transmit light (preferably, approximately 5 nm to 30 nm).

The electroluminescent layer 6045 can be formed in a manner similar to that of the electroluminescent layer 6035 of FIG. 15A.

In the case of the pixel illustrated in FIG. 15B, light emitted from the light-emitting element 6043 can be extracted from the second electrode 6046 side as shown by a hollow arrow.

Next, a cross-sectional view of a pixel in the case where a transistor 6051 is n-channel type, and light emitted from a light-emitting element 6053 is extracted from a first electrode 6054 side and a second electrode 6056 side is illustrated in FIG. 15C. The transistor 6051 is covered with an insulating film 6057, and a partition wall 6058 having an opening is formed over the insulating film 6057. In the opening of the partition wall 6058, the first electrode 6054 is partly exposed, and the first electrode 6054, an electroluminescent layer 6055, and the second electrode 6056 are sequentially stacked in the opening.

The first electrode 6054 can be formed in a manner similar to that of the first electrode 6034 of FIG. 15A. The second electrode 6056 can be formed in a manner similar to that of the second electrode 6046 of FIG. 15B. The electroluminescent layer 6055 can be formed in a manner similar to that of the electroluminescent layer 6035 of FIG. 15A.

In the case of the pixel illustrated in FIG. 15C, light emitted from the light-emitting element 6053 can be extracted from the first electrode 6054 side and the second electrode 6056 side as shown by hollow arrows.

This embodiment can be implemented in combination with any of the other embodiments as appropriate.

EMBODIMENT 8

In this embodiment, an example in which at least part of a driver circuit and a transistor to be disposed in a pixel portion are formed over one substrate is described below.

The transistor to be disposed in the pixel portion has a structure of any of the other embodiments. Since all of the transistors described in the other embodiments are n-channel transistors, part of a driver circuit which can be formed using an n-channel transistor is formed over the same substrate as the transistor of the pixel portion.

Figure 16A:
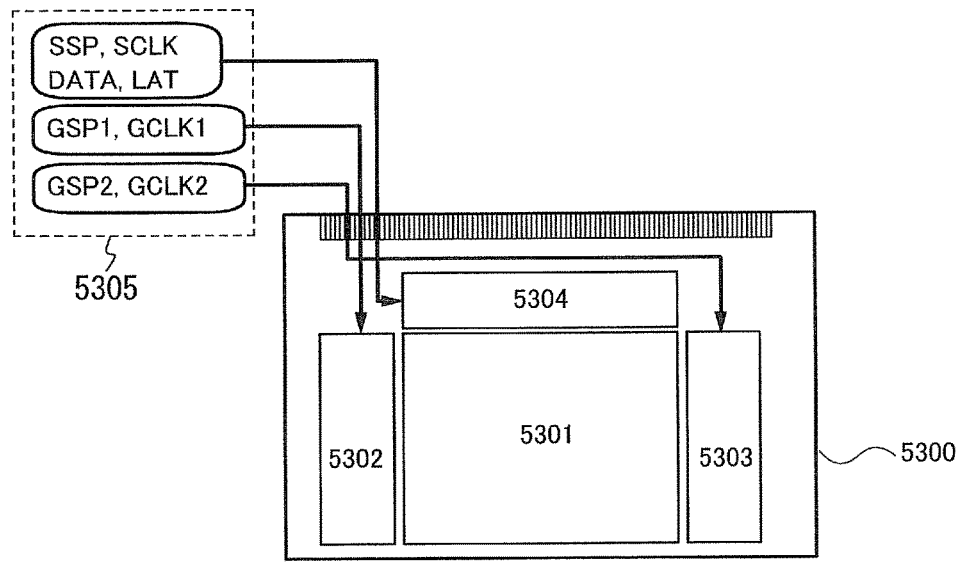
FIGS. 16A and 16B are block diagrams each illustrating a display device.

FIG. 16A is an example of a block diagram of an active matrix semiconductor display device. A pixel portion 5301, a first scan line driver circuit 5302, a second scan line driver circuit 5303, and a signal line driver circuit 5304 are formed over a substrate 5300 of the display device. A plurality of signal lines which are extended from the signal line driver circuit 5304 and a plurality of scan lines which are extended from the first scan line driver circuit 5302 and the second scan line driver circuit 5303 are provided in the pixel portion 5301. Note that pixels each including a display element are provided in a matrix in intersection regions of the scan lines and the signal lines. The substrate 5300 of the display device is connected to a timing control circuit 5305 (also referred to as a controller or a control IC) through a connection portion such as a flexible printed circuit (FPC) or the like.

In FIG. 16A, the first scan line driver circuit 5302, the second scan line driver circuit 5303, and the signal line driver circuit 5304 are formed over the same substrate 5300 as the pixel portion 5301. Accordingly, the number of components such as a driver circuit provided in an external portion is reduced, which can lead to cost reduction. Further, the number of connections which are formed at the connection portions by extension of wirings in the case of providing a driver circuit outside the substrate 5300 can be reduced. Accordingly, improvement in reliability and yield can be achieved.

The timing control circuit 5305 supplies, for example, a first scan line driver circuit start signal (GSP1) and a scan line driver circuit clock signal (GCLK1) to the first scan line driver circuit 5302. In addition, the timing control circuit 5305 supplies, for example, a second scan line driver circuit start signal (GSP2) (also referred to as a start pulse) and a scan line driver circuit clock signal (GCLK2) to the second scan line driver circuit 5303. The timing control circuit 5305 supplies a signal line driver circuit start signal (SSP), a signal line driver circuit clock signal (SCLK), a video signal data (DATA) (also simply referred to as a video signal), and a latch signal (LAT) to the signal line driver circuit 5304. One of the first scan line driver circuit 5302 and the second scan line driver circuit 5303 can be omitted.

Figure 16B:
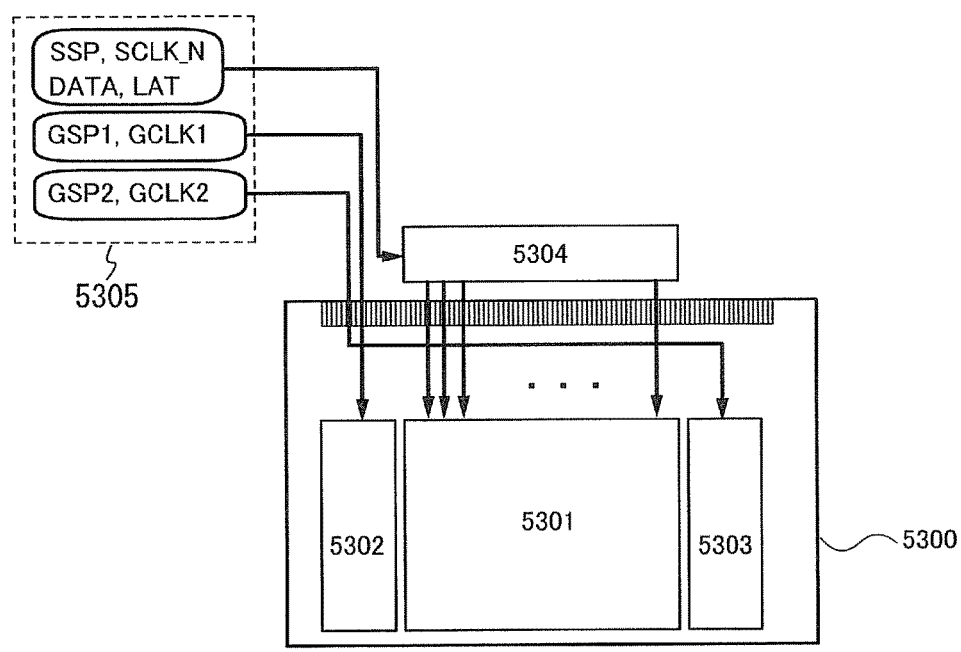

FIG. 16B shows a structure in which circuits with low driving frequency (for example, the first scan line driver circuit 5302 and the second scan line driver circuit 5303) are formed over the same substrate 5300 as the pixel portion 5301 and the signal line driver circuit 5304 is formed over a different substrate from the pixel portion 5301. With this structure, the driver circuits formed over the substrate 5300 can be formed using a transistor having lower field-effect mobility as compared to that of a transistor formed using single crystal semiconductor. Accordingly, increase in the size of the display device, reduction in the number of steps, reduction in cost, improvement in yield, or the like can be achieved.

An example of a structure and operation of a signal line driver circuit including the n-channel transistor is described with reference to FIGS. 17A and 17B.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of transistors 5603_1 to 5603_$k$ ($k$ is a natural number). A case in which the transistors 5603_1 to 5603_$k$ are n-channel transistors is exemplified.

A connection relation of the signal line driver circuit is described using the switching circuit 5602_1 as an example. Respective first terminals of the transistors 5603_1 to 5603_$k$ are connected to corresponding wirings 5604_1 to 5604_$k$. Respective second terminals of the transistors 5603_1 to 5603_$k$ are connected to corresponding signal lines S1 to Sk. Gates of the transistors 5603_1 to 5603_$k$ are connected to the shift register 5601.

The shift register 5601 has a function of sequentially selecting the switching circuits 5602_1 to 5602_N by sequentially outputting an H-level signal (also referred to as an H signal or a high power supply potential level signal) to the wirings 5605_1 to 5605_N.

The switching circuit 5602_1 has a function of controlling conduction between the wirings 5604_1 to 5604_$k$ and the signal lines S1 to Sk (conduction between the first terminals and the second terminals), that is, a function of determining whether potentials of the wirings 5604_1 to 5604_$k$ are supplied to the signal lines S1 to Sk. Thus, the switching circuit 5602_1 has a function as a selector. Further, the transistors 5603_1 to 5603_$k$ have a function of controlling conduction between the wirings 5604_1 to 5604_$k$ and the signal lines S1 to Sk, that is, a function of supplying potentials of the wirings 5604_1 to 5604_$k$ to the signal lines S1 to Sk. Thus, the transistors 5603_1 to 5603_$k$ each function as a switch.

Note that a video signal data (DATA) is input to each of the wirings 5604_1 to 5604_$k$. The video signal data (DATA) is, in many cases, an analog signal corresponding to image data or an image signal.

Figure 17A:
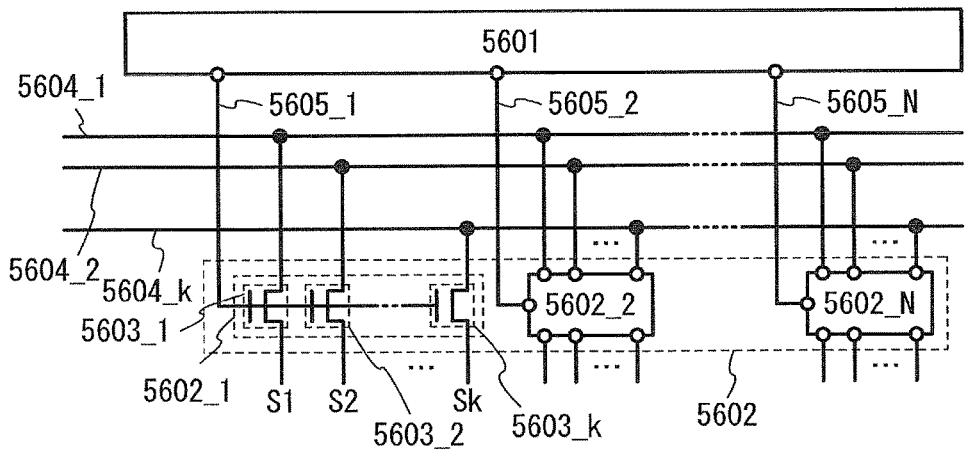
FIGS. 17A and 17B are views each illustrating a structure of a signal line driver circuit.
Figure 17B:
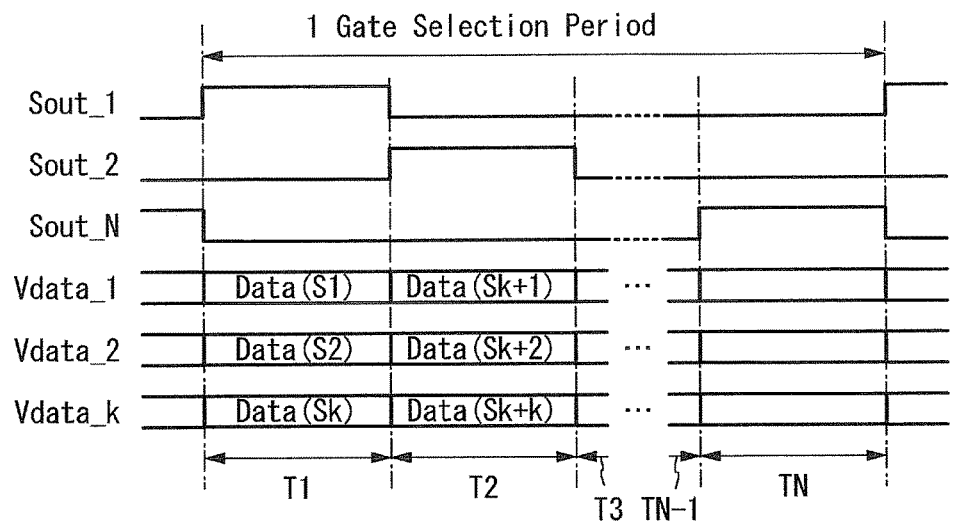

Next, operation of the signal line driver circuit shown in FIG. 17A is described with reference to a timing chart of FIG. 17B. Examples of signals Sout_1 to Sout_N and signals Vdata_1 to Vdata_$k$ are shown in FIG. 17B. The signals Sout_1 to Sout_N are examples of output signals of the shift register 5601, and the signals Vdata_1 to Vdata_$k$ are examples of signals which are input to the wirings 5604_1 to 5604_$k$. Note that one operation period of the signal line driver circuit corresponds to one gate selection period in the display device. For example, one gate selection period is divided into periods T1 to TN. Each of the periods T1 to TN is a period for writing a video signal data (DATA) to pixels belonging to the selected row.

In the periods T1 to TN, the shift register 5601 sequentially outputs an H-level signal to the wirings 5605_1 to 5605_N. For example, in the period T1, the shift register 5601 outputs a high-level signal to the wiring 5605_1. Then, the transistors 5603_1 to 5603_$k$ are turned on, so that the wirings 5604_1 to 5604_$k$ and the signal lines S1 to Sk are brought into conduction. At this time, Data (S1) to Data (Sk) are input to the wirings 5604_1 to 5604_$k$. The Data (S1) to Data (Sk) are input to pixels in the first to k-th columns in the selected row through the transistors 5603_1 to 5603_$k$. Thus, video signal data (DATA) are sequentially written to pixels in the selected row by k columns in the periods T1 to TN.

By writing video signal data (DATA) to pixels by plural columns in the above-described manner, the number of video signal data (DATA) or the number of wirings can be reduced. Accordingly, the number of connections to an external circuit can be reduced. Further, by writing video signals to pixels by plural columns, writing time can be extended and shortage of writing of video signals can be prevented.

Note that a circuit including the transistor described in any of the other embodiments can be used as the shift register 5601 and the switching circuit 5602. In this case, all transistors included in the shift register 5601 can be formed to have only either n-channel or p-channel.

The structure of a scan line driver circuit is described. The scan line driver circuit includes a shift register. Additionally, the scan line driver circuit may include a level shifter, a buffer, or the like depending on the conditions. In the scan line driver circuit, when a clock signal (CLK) and a start pulse signal (SP) are input to the shift register, a selection signal is generated. The generated selection signal is buffered and amplified by a buffer, and the resulting signal is supplied to a corresponding scan line. Gate electrodes of transistors of pixels in one line are connected to a scan line. Since the transistors of the pixels in one line have to be turned on all at once, a buffer which can supply a large current is used.

One mode of the shift register used for part of the scan line driver circuit and/or the signal line driver circuit is described with reference to FIGS. 18A to 18C and FIGS. 19A and 19B.

Figure 18A:
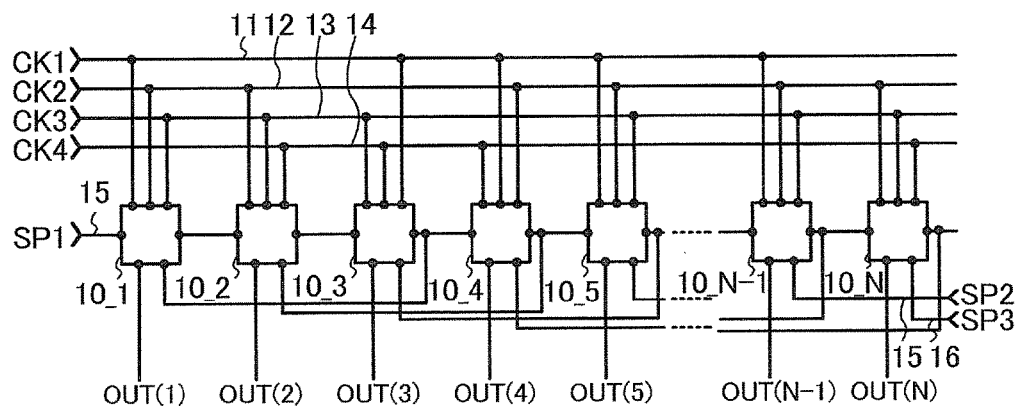
FIGS. 18A to 18C are circuit diagrams each illustrating a structure of a shift register.

A shift register of a scan line driver circuit and/or a signal line driver circuit is described with reference to FIGS. 18A to 18C and FIGS. 19A and 19B. The shift register includes first to N-th pulse output circuits 10_1 to 10_N (N≥3 and N is a natural number) (see FIG. 18A). A first clock signal CK1, a second clock signal CK2, a third clock signal CK 3, and a fourth clock signal CK 4 are supplied to the first to N-th pulse output circuits 10_1 to 10_N of the shift register shown in FIG. 18A from a first wiring 11, a second wiring 12, a third wiring 13, and a fourth wiring 14, respectively. Further, a start pulse SP1 (first start pulse) is input to the first pulse output circuit 10_1 from a fifth wiring 15. A signal output from the pulse output circuit 10_$n$−1 in the previous stage (referred to as a previous stage signal OUT(n−1)) (2≤n≤N and n is a natural number) is input to an n-th pulse output circuit 10_$n$ in the second or later stage. In addition, a signal from the third pulse output circuit 10_3 is input to the first pulse output circuit 10_1 in the two stages before the third pulse output circuit 10_3. In a similar manner, a signal from the pulse output circuit 10_(n+2) in two stages after the n-th pulse output circuit 10_$n$ (also referred to as a later-stage signal OUT(n+2)) is input to the n-th pulse output circuit 10_$n$ in the second or later stage. Thus, from the pulse output circuit in each stage, first output signals (OUT(1)(SR) to OUT(N) (SR)) to be input to a pulse output circuit in the later stage and/or the two stages before the pulse output circuit and second output signals (OUT(1) to OUT (N)) to be input to another wiring or the like are output. Since later-stage signals OUT(n+2) are not input to the pulse output circuits in the last two stages of the shift register, a structure in which a second start pulse SP2 and a third start pulse SP3 are input to the respective pulse output circuits may be employed, for example, as shown in FIG. 18A.

Note that the clock signal (CK) is a signal which becomes an H-level signal and an L-level signal (also referred to as an L signal or a low power supply potential level signal) repeatedly at a regular interval. Here, the first to fourth clock signals (CK1) to (CK4) are sequentially deviated by 1/4 period. In this embodiment, by using the first to fourth clock signals (CK1) to (CK4), control of driving of the pulse output circuits or the like is performed. Although the clock signal is also represented by GCK or SCK depending on the driver circuit to which the signal is input, CK is used here.

A first input terminal 21, a second input terminal 22, and a third input terminal 23 are electrically connected to any of the first to fourth wirings 11 to 14. For example, in FIG. 18A, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In addition, the first input terminal 21 of the second pulse output circuit 10_2 is electrically connected to the second wiring 12, the second input terminal 22 of the second pulse output circuit 10_2 is electrically connected to the third wiring 13, and the third input terminal 23 of the second pulse output circuit 10_2 is electrically connected to the fourth wiring 14.

Figure 18B:
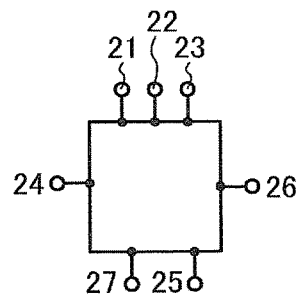

Each of the first to N-th pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 18B). A first clock signal CK1, a second clock signal CK2, a third clock signal CK3, a start pulse, a later-stage signal OUT(3) are input to the first input terminal 21, the second input terminal 22, the third input terminal 23, the fourth input terminal 24, and the fifth input terminal 25 of the first pulse output circuit 10_1, respectively. A first output signal OUT(1) (SR) and a second output signal OUT(1) are output from the first output terminal 26 and the second output terminal 27, respectively.

Next, an example of a specific circuit structure of the pulse output circuit is described with reference to FIG. 18C.

Figure 18C:
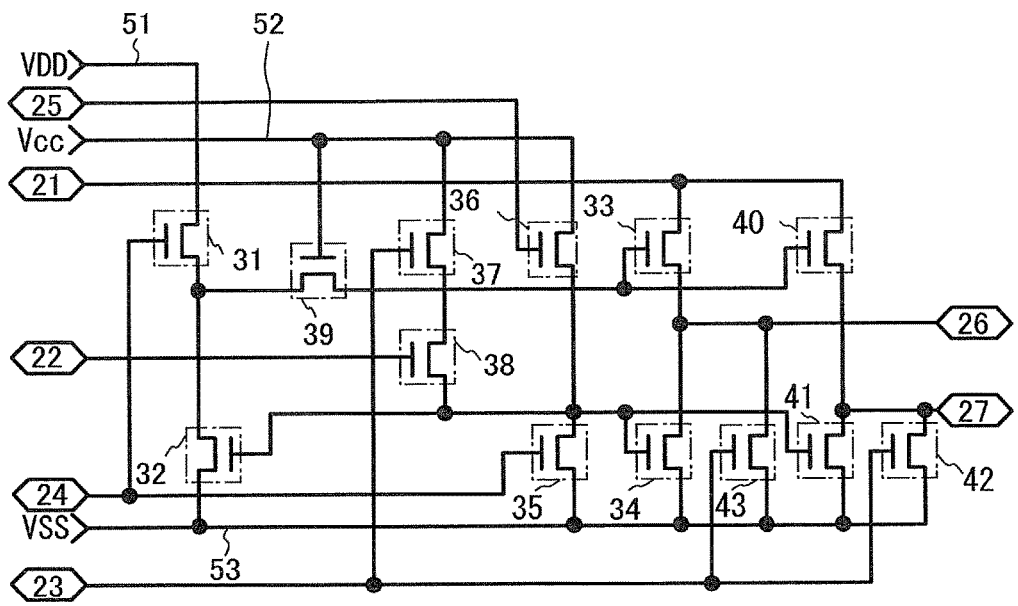

The first pulse output circuit 10_1 includes first to thirteenth transistors 31 to 43 (see FIG. 18C). Signals or power supply potentials are supplied to the first to thirteenth transistors 31 to 43 from a power supply line 51 which supplies a first high power supply potential VDD, a power supply line 52 which supplies a second high power supply potential VCC, and a power supply line 53 which supplies a low power supply potential VSS, in addition to the above-described first to fifth input terminals 21 to 25, the first output terminal 26, and the second output terminal 27. Here, power supply potentials of the power supply lines in FIG. 18C have the following relation: the first power supply potential VDD is higher than or equal to the second high power supply potential VCC, and the second high power supply potential VCC is higher than the third power supply potential VSS. The first to fourth clock signals (CK1) to (CK4) are signals which become H-level signals and L-level signals repeatedly at a regular interval. The potential is VDD when the clock signal is at the H level, and the potential is VSS when the clock signal is at the L level. When the potential VDD of the power supply line 51 is higher than the potential VCC of the power supply line 52, a potential applied to the gate electrode of the transistor can be suppressed to be low, the shift of the threshold value of the transistor can be reduced, and deterioration can be suppressed without affecting the operation.

In FIG. 18C, a first terminal of the first transistor 31 is electrically connected to the power supply line 51, a second terminal of the first transistor 31 is electrically connected to a first terminal of the ninth transistor 39, and a gate electrode of the first transistor 31 is electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and a gate electrode of the sixth transistor 36 is electrically connected to the fifth input terminal 25. A first terminal of the seventh transistor 37 is electrically connected to the power supply line 52, a second terminal of the seventh transistor 37 is electrically connected to a second terminal of the eighth transistor 38, and a gate electrode of the seventh transistor 37 is electrically connected to the third input terminal 23. A first terminal of the eighth transistor 38 is electrically connected to the gate electrode of the second transistor 32 and the gate electrode of the fourth transistor 34, and a gate electrode of the eighth transistor 38 is electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and a gate electrode of the ninth transistor 39 is electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrode of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrode of the seventh transistor 37.

In FIG. 18C, the point at which the gate electrode of the third transistor 33, the gate electrode of the tenth transistor 40, and the second terminal of the ninth transistor 39 are connected is referred to as a node A. Further, the point at which the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B (see FIG. 19A).

Note that a transistor is an element having at least three terminals of a gate, a drain, and a source. The transistor has a channel region between a drain region and a source region, and current can flow through the drain region, the channel region, and the source region. Here, since the source and the drain of the transistor may interchange depending on the structure, the operating condition, and the like of the transistor, it is difficult to define which is a source or a drain. Therefore, a region functioning as a source or a drain is not called the source or the drain in some cases. In such a case, for example, one of the source and the drain may be referred to as a first terminal and the other thereof may be referred to as a second terminal.

Figure 19A:
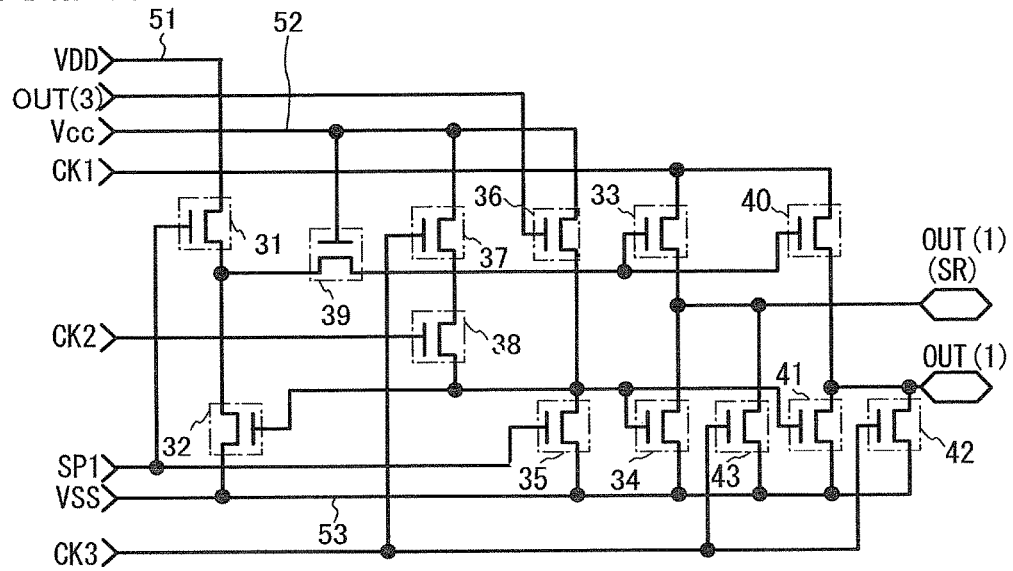
FIG. 19A is a circuit diagram illustrating a structure of a shift register and FIG. 19B is a timing chart illustrating an operation of the shift register.
Figure 19B:
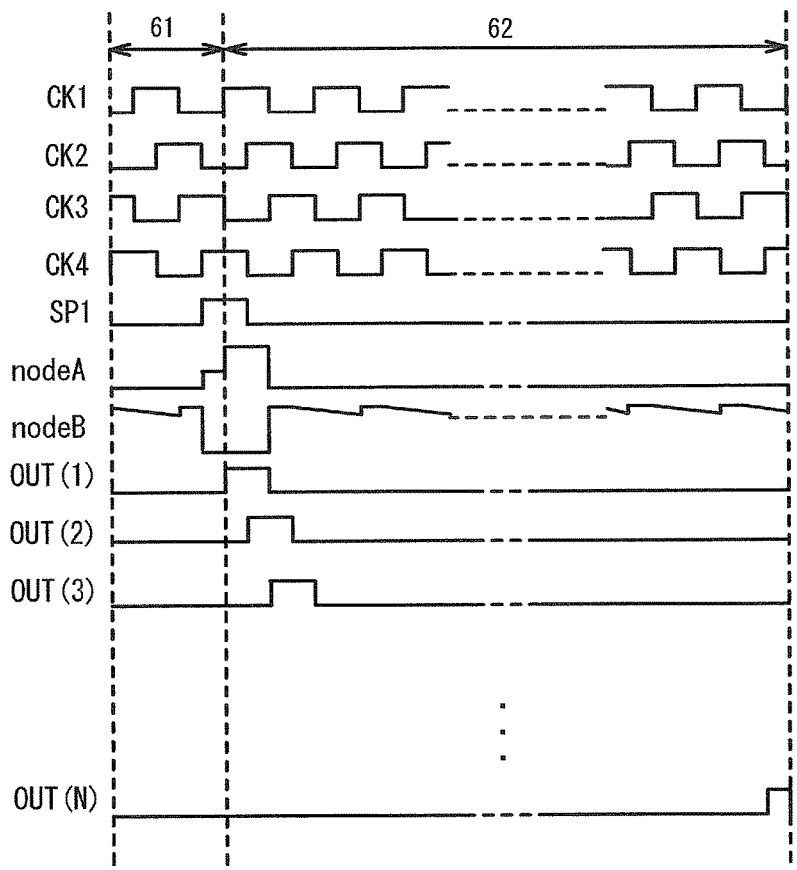

FIG. 19B shows a timing chart of the shift register including a plurality of pulse output circuits shown in FIG. 19A. In the case where the shift register is a scan line driver circuit, a period 61 in FIG. 19B is a vertical retrace period and a period 62 is a gate selection period.

EXAMPLE 1

In this example, a structure of the liquid crystal display device according to an embodiment of the present invention is described.

Figure 20:
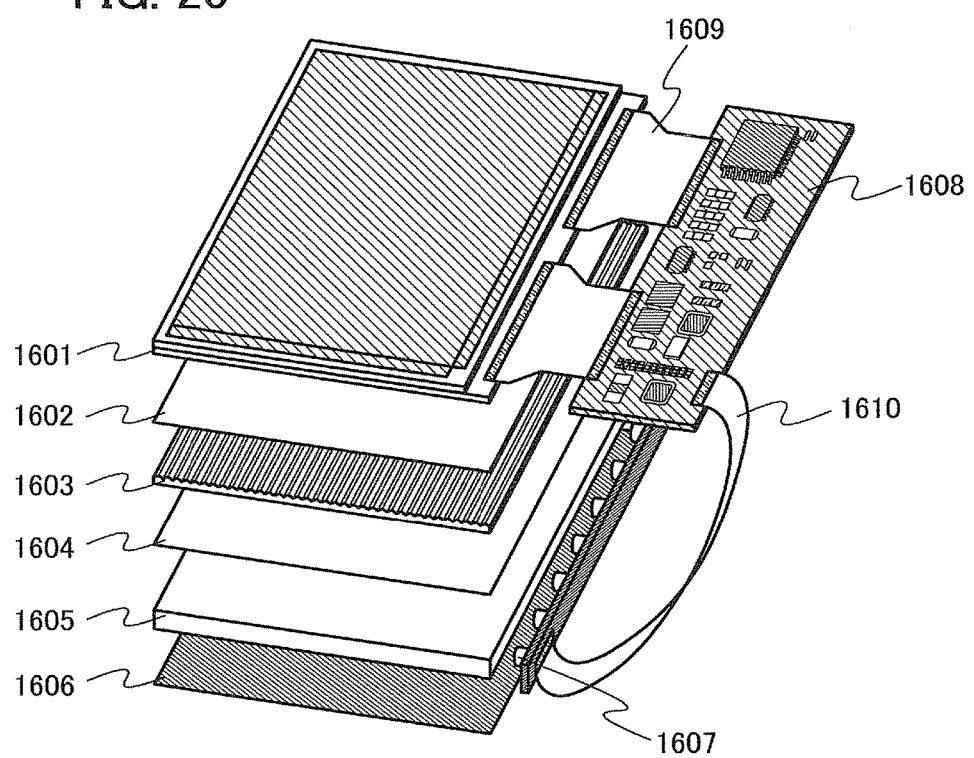
FIG. 20 is a view illustrating a structure of a liquid crystal display device module.

FIG. 20 illustrates an example of a perspective view showing a structure of the liquid crystal display device of the present invention. The liquid crystal display device illustrated in FIG. 20 is provided with a liquid crystal panel 1601 in which a liquid crystal element is formed between a pair of substrates; a first diffusing plate 1602; a prism sheet 1603; a second diffusing plate 1604; a light guide plate 1605; a reflection plate 1606; a light source 1607; and a circuit substrate 1608.

The liquid crystal panel 1601, the first diffusing plate 1602, the prism sheet 1603, the second diffusing plate 1604, the light guide plate 1605, and the reflection plate 1606 are stacked in this order. The light source 1607 is provided at an end portion of the light guide plate 1605. The liquid crystal panel 1601 is uniformly irradiated with light from the light source 1607 which is diffused inside the light guide plate 1605, due to the first diffusing plate 1602, the prism sheet 1603, and the second diffusing plate 1604.

Although the first diffusing plate 1602 and the second diffusing plate 1604 are used in this example, the number of diffusing plates is not limited thereto. The number of diffusing plates may be one, or may be three or more. It is acceptable as long as the diffusing plate is provided between the light guide plate 1605 and the liquid crystal panel 1601. Therefore, a diffusing plate may be provided only on the side closer to the liquid crystal panel 1601 than the prism sheet 1603, or may be provided only on the side closer to the light guide plate 1605 than the prism sheet 1603.

Further, the cross section of the prism sheet 1603 is not limited to a sawtooth-shape illustrated in FIG. 20. The prism sheet 1603 may have a shape with which light from the light guide plate 1605 can be concentrated on the liquid crystal panel 1601 side.

The circuit substrate 1608 is provided with a circuit which generates various kinds of signals input to the liquid crystal panel 1601, a circuit which processes the signals, or the like. In FIG. 20, the circuit substrate 1608 and the liquid crystal panel 1601 are connected to each other via a flexible printed circuit (FPC) 1609. Note that the circuit may be connected to the liquid crystal panel 1601 by using a chip on glass (COG) method, or part of the circuit may be connected to the FPC 1609 by using a chip on film (COF) method.

FIG. 20 illustrates an example in which the circuit substrate 1608 is provided with a controlling circuit which controls driving of the light source 1607 and the controlling circuit and the light source 1607 are connected to each other via the FPC 1610. However, the controlling circuit may be formed in the liquid crystal panel 1601; in this case, the liquid crystal panel 1601 and the light source 1607 are connected to each other via the FPC or the like.

Although FIG. 20 illustrates as an example of an edge-light type light source in which the light source 1607 is disposed at an end portion of the liquid crystal panel 1601, a liquid crystal display device of the present invention may be a direct type which includes the light source 1607 disposed directly below the liquid crystal panel 1601.

This example can be implemented in combination with any of the other embodiments as appropriate.

EXAMPLE 2

By using the manufacturing method of the present invention, a highly reliable transistor can be formed. Accordingly, with the use of the manufacturing method according to an embodiment of the present invention, a highly reliable semiconductor device with high performance can be provided.

Moreover, by using the manufacturing method of the present invention, the heat treatment temperature can be suppressed; therefore, a highly reliable transistor with excellent characteristics can be formed even when the transistor is formed over a substrate formed using a flexible synthetic resin of which heat resistance is lower than that of glass, such as plastic. Accordingly, with the use of the manufacturing method according to an embodiment of the present invention, a highly reliable, lightweight, and flexible semiconductor device with high performance can be provided. As a plastic substrate, the following can be used: polyester typified by polyethylene terephthalate (PET); polyethersulfone (PES); polyethylene naphthalate (PEN); polycarbonate (PC); polyetheretherketone (PEEK); polysulfone (PSF); polyetherimide (PEI); polyarylate (PAR); polybutylene terephthalate (PBT); polyimide; an acrylonitrile-butadiene-styrene resin; polyvinyl chloride; polypropylene; polyvinyl acetate; an acrylic resin; or the like.

Electronic devices including the semiconductor device formed by the manufacturing method according to an embodiment of the present invention can be used for display devices, laptops, or image reproducing devices provided with recording media (typically, devices which reproduce the content of recording media such as digital versatile discs (DVDs) and have displays for displaying the reproduced images). Further, the electronic devices including the semiconductor device formed by the manufacturing method according to an embodiment of the present invention can be used for mobile phones, portable game machines, portable information terminals, e-book readers, IC cards or tags included in RFIDs, video cameras, digital still cameras, goggle-type displays (head mounted displays), navigation systems, audio reproducing devices (for example, car audio systems or digital audio players), or the like. FIGS. 21A to 21D each illustrate specific examples of these electronic devices.

Figure 21A:
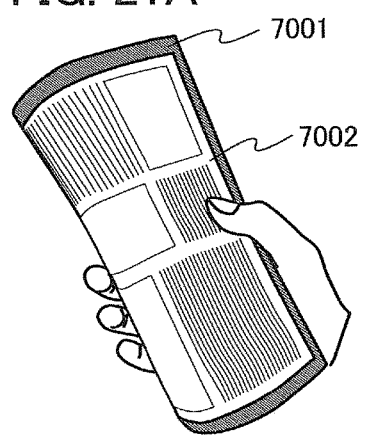
FIGS. 21A to 21D are views each illustrating an electronic device including a semiconductor device.

FIG. 21A illustrates an e-book reader including a housing 7001, a display portion 7002, and the like. The semiconductor device according to an embodiment of the present invention can be used for the display portion 7002, a signal processing circuit, or the like. By including the semiconductor device according to an embodiment of the present invention in the display portion 7002, the signal processing circuit, or the like, a highly reliable e-book reader with high performance can be provided. Moreover, with the use of a flexible substrate, the semiconductor display device, the signal processing circuit, or the like included in the display portion 7002 can have flexibility. Thus, a highly reliable, flexible, lightweight, and useful e-book reader with high performance can be provided.

Figure 21B:
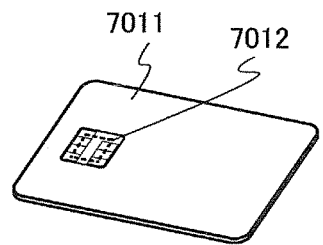

FIG. 21B illustrates an IC card including a housing 7011, an IC chip 7012, and the like. The semiconductor device according to an embodiment of the present invention can be used for the IC chip 7012. By including the semiconductor device according to an embodiment of the present invention in the IC chip 7012, a highly reliable IC card with high performance can be provided. Moreover, with the use of a flexible substrate, the IC chip 7012 can have flexibility. Thus, a lightweight IC card with high durability can be provided. Although FIG. 21B illustrates an example of a contact-type IC card, the semiconductor device according to an embodiment of the present invention can be used for contactless IC cards having antennas.

Figure 21C:
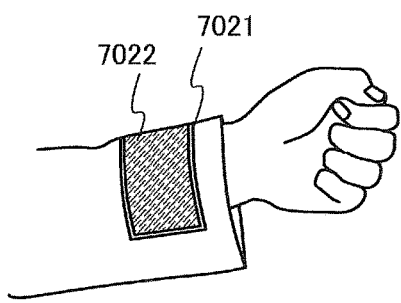

FIG. 21C illustrates a display device including a housing 7021, a display portion 7022, and the like. The semiconductor device according to an embodiment of the present invention can be used for the display portion 7022, a signal processing circuit, or the like. By including the semiconductor device according to an embodiment of the present invention in the display portion 7022, the signal processing circuit, or the like, a highly reliable display device with high performance can be provided. Moreover, with the use of a flexible substrate, the semiconductor display device, the signal processing circuit, or the like included in the display portion 7022 can have flexibility. Thus, a highly reliable, flexible, and lightweight display device with high performance can be provided. Accordingly, as illustrated in FIG. 21C, a display device can be used while being fixed to fabric or the like, and an application range of the semiconductor device is dramatically widened.

Figure 21D:
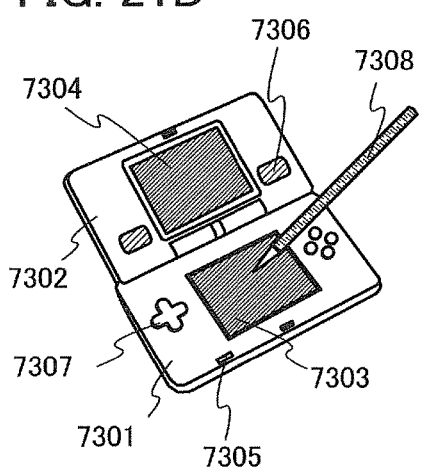

FIG. 21D illustrates portable game machines including a housing 7301, a housing 7302, a display portion 7303, a display portion 7304, a microphone 7305, a speaker 7306, an operation key 7307, a stylus 7308, and the like. The semiconductor device according to an embodiment of the present invention can be used for the display portion 7303, the display portion 7304, a signal processing circuit, or the like. By including the semiconductor device according to an embodiment of the present invention in the display portion 7303, the display portion 7304, the signal processing circuit, or the like, a highly reliable portable game machine with higher-performance applications can be provided. Although the portable game machine illustrated in FIG. 21D has the two display portions 7303 and 7304, the number of display portions included in the portable game machines is not limited thereto.

This example can be implemented in combination with any of the other embodiments and the other example as appropriate.

This application is based on Japanese Patent Application serial no. 2009-168650 filed with Japanese Patent Office on Jul. 17, 2009, the entire contents of which are hereby incorporated by reference.

The invention claimed is:

1. A method of manufacturing a semiconductor device comprising the steps of:
   forming an oxide semiconductor layer over a substrate; and
   irradiating the oxide semiconductor layer with microwaves to reduce a concentration of hydrogen in the oxide semiconductor layer.

2. The method according to claim 1, wherein the oxide semiconductor layer comprises In, Ga, Zn and O.

3. The method according to claim 1, wherein the concentration of hydrogen in the oxide semiconductor layer after the step of irradiating is $5 \times 10^{19}/cm^3$ or less.

4. The method according to claim 1, wherein the oxide semiconductor layer is irradiated with microwaves in an inert gas atmosphere.

5. A method of manufacturing a semiconductor device comprising the steps of:
   forming an oxide semiconductor layer over a substrate;
   placing the substrate in a treatment chamber;
   supplying a gas to the treatment chamber; and
   treating the oxide semiconductor layer by supplying microwaves to the gas in the treatment chamber to reduce a concentration of hydrogen in the oxide semiconductor layer,
   wherein the gas is made into plasma by the microwaves.

6. The method according to claim 5, wherein the oxide semiconductor layer comprises In, Ga, Zn and O.

7. The method according to claim 5, wherein the concentration of hydrogen in the oxide semiconductor layer after the step of treating is $5 \times 10^{19}/cm^3$ or less.

8. The method according to claim 5, wherein the gas is an inert gas.

9. A method of manufacturing a semiconductor device comprising the steps of:
   forming an oxide semiconductor layer over a substrate;
   forming a source electrode layer and a drain electrode layer, wherein a portion of the oxide semiconductor layer is exposed between the source electrode layer and the drain electrode layer; and
   irradiating the oxide semiconductor layer with microwaves to reduce a concentration of hydrogen in the oxide semiconductor layer after forming the source electrode layer and the drain electrode layer.

10. The method according to claim 9, wherein the oxide semiconductor layer comprises In, Ga, Zn and O.

11. The method according to claim 9, wherein the concentration of hydrogen in the oxide semiconductor layer after the step of irradiating is $5 \times 10^{19}/cm^3$ or less.

12. The method according to claim 9, wherein the oxide semiconductor layer is irradiated with microwaves in an inert gas atmosphere.

* * * * *